(12) United States Patent
Wen et al.

(10) Patent No.: US 10,660,224 B2
(45) Date of Patent: May 19, 2020

(54) HEAD-MOUNTED DISPLAY DEVICE

(71) Applicant: HTC Corporation, Taoyuan (TW)

(72) Inventors: Hung-Chuan Wen, Taoyuan (TW);
Chien-Hsin Liu, Taoyuan (TW);
Chang-Hua Wei, Taoyuan (TW)

(73) Assignee: HTC Corporation, Taoyuan (TW)

( * ) Notice: Subject to any disclaimer, the term of this patent is extended or adjusted under 35 U.S.C. 154(b) by 215 days.

(21) Appl. No.: 15/933,391

(22) Filed: Mar. 23, 2018

(65) Prior Publication Data
US 2018/0295733 A1 Oct. 11, 2018

Related U.S. Application Data

(60) Provisional application No. 62/475,896, filed on Mar. 24, 2017.

(51) Int. Cl.
*G02C 3/00* (2006.01)
*H05K 5/02* (2006.01)
(Continued)

(52) U.S. Cl.
CPC ....... *H05K 5/0217* (2013.01); *G02B 27/0176* (2013.01); *G02C 3/003* (2013.01);
(Continued)

(58) Field of Classification Search
CPC ........ G02B 27/0176; G02B 2027/0181; G02C 3/00; G02C 3/003; H05K 5/0217; H05K 5/0017; H05K 5/0086; A42B 3/145
(Continued)

(56) References Cited

U.S. PATENT DOCUMENTS 5,767,820 A * 6/1998 Bassett ................ G02B 27/017
345/7
2013/0249778 A1* 9/2013 Morimoto .......... G02B 27/0176
345/8
(Continued)

FOREIGN PATENT DOCUMENTS

CN 205958850 2/2017
CN 205958855 2/2017
(Continued)

OTHER PUBLICATIONS

"Office Action of Taiwan Counterpart Application", dated Dec. 22, 2018, p. 1-p. 10.
(Continued)

*Primary Examiner* — Corey N Skurdal
(74) *Attorney, Agent, or Firm* — JCIPRNET

(57) ABSTRACT

A head-mounted display device including a front element, a pair of extending portions, an adjustable fixing assembly, a top adjustable fixing assembly, a rear adjustable fixing assembly, and a rotatable adjusting mechanism is provided. The front element is adapted to be placed or be installed with a display device and is adapted to cover eyes of a user. The top adjustable fixing assembly is adapted to be in contact with a parietal bone of the user. The rear adjustable fixing assembly is adapted to be in contact with an occipital bone of the user. The adjustable fixing assembly and the top adjustable fixing assembly are adjustable according to head shapes of different users. The rotatable adjusting mechanism adjusts the rear adjustable fixing assembly so that the rear adjustable fixing assembly is adapted to head shapes of different users.

30 Claims, 12 Drawing Sheets

(51) Int. Cl.
*G02B 27/01* (2006.01)
*H05K 5/00* (2006.01)
*A42B 3/14* (2006.01)

(52) U.S. Cl.
CPC ......... *H05K 5/0017* (2013.01); *H05K 5/0086* (2013.01); *A42B 3/145* (2013.01); *G02B 2027/0181* (2013.01)

(58) Field of Classification Search
USPC ....................................................... 224/181
See application file for complete search history.

(56) References Cited

U.S. PATENT DOCUMENTS

| | | | | |
|---|---|---|---|---|
| 2016/0054571 A1* | 2/2016 | Tazbaz | ............... | G02B 27/0176 359/630 |
| 2016/0062125 A1* | 3/2016 | Baek | ................. | G02B 27/0176 361/679.01 |
| 2016/0249124 A1* | 8/2016 | Drinkwater | ........... | G06F 1/1605 |
| 2016/0299346 A1 | 10/2016 | Allin et al. | | |
| 2017/0094816 A1* | 3/2017 | Yun | ...................... | G02B 27/022 |
| 2017/0367423 A1* | 12/2017 | Reitz | ....................... | A42B 1/22 |
| 2018/0055202 A1* | 3/2018 | Miller | ................ | G02B 27/0176 |
| 2018/0321707 A1* | 11/2018 | Hu | ............................ | G02C 5/22 |
| 2018/0338130 A1* | 11/2018 | Miller | ................ | G02B 27/0176 |
| 2019/0346682 A1* | 11/2019 | Kang | ................. | G02B 27/0176 |

FOREIGN PATENT DOCUMENTS

| | | |
|---|---|---|
| EP | 0551781 | 7/1993 |
| JP | 2009111512 | 5/2009 |

OTHER PUBLICATIONS

"Search Report of Europe Counterpart Application", dated Sep. 27, 2018, p. 1-p. 12.

* cited by examiner

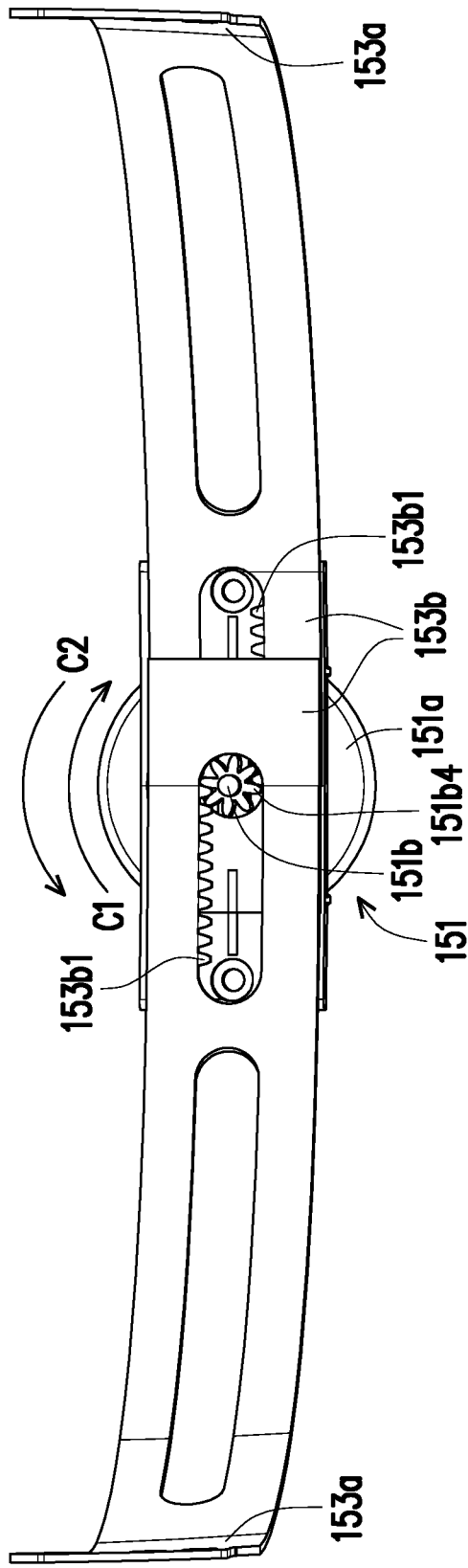
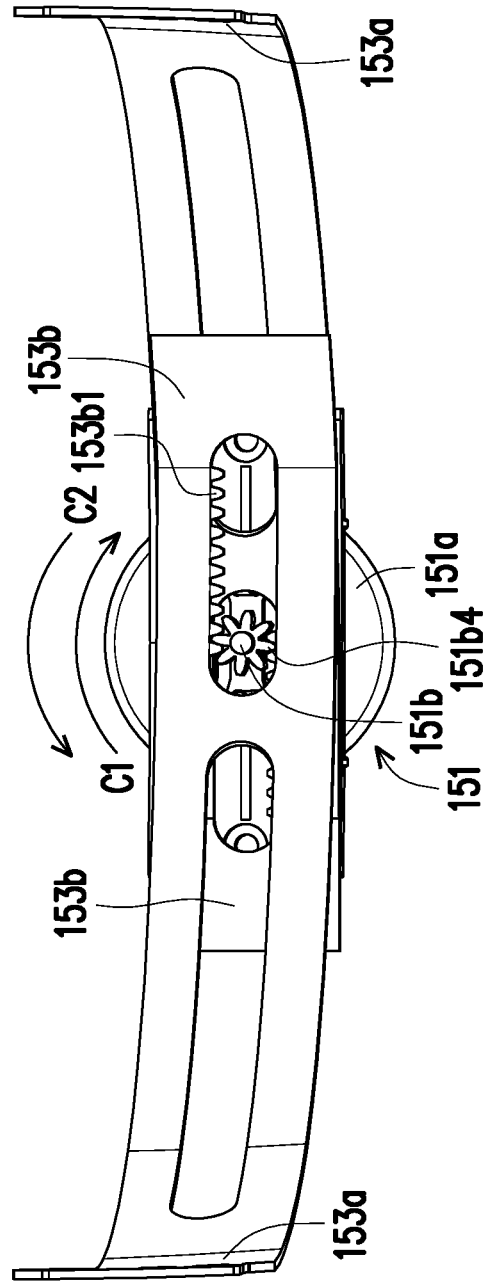
FIG. 5C
FIG. 5D

HEAD-MOUNTED DISPLAY DEVICE

CROSS-REFERENCE TO RELATED APPLICATION

This application claims the priority benefit of U.S. provisional application Ser. No. 62/475,896, filed on Mar. 24, 2017. The entirety of the above-mentioned patent application is hereby incorporated by reference herein and made a part of this specification.

BACKGROUND

Technical Field

The application relates to a head-mounted display device, and in particular, to a head-mounted display device that is adapted to head shapes of different users.

Description of Related Art

As technology advances, forms, functions, and uses of electronic devices have become more and more diversified, and wearable electronic devices directly worn on a user's body have also been developed. Head-mounted electronic devices come in many types. Taking goggle-type head-mounted electronic devices as an example, after a user wears an electronic device of this type, the user not only sees 3D images, but the images change as the user turns his/her head, which provides the user with a more vicarious experience.

However, it is likely that it is difficult for the user to properly adjust and comfortably wear the head-mounted display device by using the integrated mask or pad currently available for VR techniques, which may have a negative impact on the user experience.

SUMMARY

The application provides a head-mounted display device that is adapted to head shapes of different users and is easy to adjust and operate.

A head-mounted display device of the application includes a front element, a pair of extending portions, and an adjustable fixing assembly. The front element is adapted to be placed or be installed with a display device. The pair of extending portions is respectively connected to two opposite ends of the front element. Two opposite ends of the adjustable fixing assembly are slidably disposed at the pair of extending portions. The adjustable fixing assembly is adapted to be subjected to an external force to move in a first sliding direction away from the front element. When the external force is removed from the adjustable fixing assembly that has been moved in the first sliding direction, the adjustable fixing assembly is adapted to move in a second sliding direction opposite to the first sliding direction.

In an embodiment of the application, the adjustable fixing assembly includes a frame and a pair of connection members. The pair of connection members are respectively connected to two opposite ends of the frame, and the pair of connection members are slidably disposed at the pair of extending portions.

In an embodiment of the application, the two opposite ends of the frame are rotatably disposed at the pair of connection members.

In an embodiment of the application, the extending portion includes a slide groove, and the adjustable fixing assembly includes a sliding member, a first fixing portion, a second fixing portion, and a restoring member. The sliding member is fixed to the connection member and is slidably disposed in the slide groove. The first fixing portion is disposed in the slide groove. The second fixing portion is disposed on the sliding member. Two opposite ends of the restoring member are respectively fixed to the first fixing portion and the second fixing portion.

In an embodiment of the application, the extending portion has a first end and a second end opposite to each other. The second end includes a first stop portion. The sliding member includes a second stop portion corresponding to the first stop portion. The second stop portion is adapted to reciprocatingly slide between the first end and the second end.

In an embodiment of the application, the head-mounted display device further includes a top adjustable fixing assembly. Two opposite ends of the top adjustable fixing assembly are slidably disposed at the adjustable fixing assembly. The top adjustable fixing assembly is adapted to be subjected to an acting force to move in a first deviation direction, and the two opposite ends of the top adjustable fixing assembly are adapted to move in directions toward each other due to the acting force. When the acting force is removed from the top adjustable fixing assembly that has been moved in the first deviation direction, the top adjustable fixing assembly is adapted to move in a second deviation direction opposite to the first deviation direction, and the two opposite ends of the top adjustable fixing assembly are adapted to move in directions away from each other.

In an embodiment of the application, the head-mounted display device further includes a rear adjustable fixing assembly including a rotatable adjusting mechanism. Two opposite ends of the rear adjustable fixing assembly are slidably disposed at the adjustable fixing assembly. The rotatable adjusting mechanism is adapted to rotate in a first rotation direction, and the rear adjustable fixing assembly is adapted to move in a first translational direction perpendicular to the first rotation direction due to rotation of the rotatable adjusting mechanism in the first rotation direction. When the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

In an embodiment of the application, the first translational direction is a direction toward the front element.

In an embodiment of the application, the head-mounted display device further includes an elastic cover member fixed to the adjustable fixing assembly. Two opposite ends of the elastic cover member are adapted to be subjected to a propping force to move in a first movement direction, and the two opposite ends of the elastic cover member are adapted to move in directions toward each other due to the propping force. When the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

In an embodiment of the application, the first movement direction is a direction away from the front element.

A head-mounted display device of the application includes a front element, a pair of extending portions, an adjustable fixing assembly, a top adjustable fixing assembly, and a rear adjustable fixing assembly. The front element is adapted to be placed or be installed with a display device. The pair of extending portions is respectively connected to two opposite ends of the front element. The adjustable fixing assembly includes a frame. The frame includes a body portion and a pair of protruding portions. Two opposite ends of the body portion are connected to the pair of extending portions. The pair of protruding portions is respectively connected to the two opposite ends of the body portion. Two opposite ends of the top adjustable fixing assembly are connected to the body portion. Two opposite ends of the rear adjustable fixing assembly are connected to the pair of protruding portions. An included angle is present between the body portion and the protruding portion.

In an embodiment of the application, the included angle ranges from 30° to 150°.

In an embodiment of the application, the two opposite ends of the top adjustable fixing assembly are slidably disposed at the body portion. The top adjustable fixing assembly is adapted to be subjected to an acting force to move in a first deviation direction, and the two opposite ends of the top adjustable fixing assembly are adapted to move in directions toward each other due to the acting force. When the acting force is removed from the top adjustable fixing assembly that has been moved in the first deviation direction, the top adjustable fixing assembly is adapted to move in a second deviation direction opposite to the first deviation direction, and the two opposite ends of the top adjustable fixing assembly are adapted to move in directions away from each other.

In an embodiment of the application, the body portion includes a top slide groove, and the top adjustable fixing assembly includes a flexible body, a top sliding member, a first top fixing portion, a second top fixing portion, and a top restoring member. The top sliding member is fixed to the flexible body and is slidably disposed in the top slide groove. The first top fixing portion is disposed in the top slide groove. The second top fixing portion is disposed on the top sliding member. Two opposite ends of the top restoring member are respectively fixed to the first top fixing portion and the second top fixing portion.

In an embodiment of the application, the top adjustable fixing assembly further includes a buffer material layer.

In an embodiment of the application, the flexible body is adapted to be subjected to an acting force to move in a first deviation direction, and two opposite ends of the flexible body are adapted to move in directions toward each other due to the acting force. When the acting force is removed from the flexible body that has been moved in the first deviation direction, the flexible body is adapted to move in a second deviation direction opposite to the first deviation direction, and the two opposite ends of the flexible body are adapted to move in directions away from each other.

In an embodiment of the application, the head-mounted display device further includes an elastic cover member fixed to the rear adjustable fixing assembly. The elastic cover member is adapted to be subjected to a propping force to move in a first movement direction, and two opposite ends of the elastic cover member are adapted to move in directions toward each other due to the propping force. When the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

In an embodiment of the application, the elastic cover member includes a soft material layer.

In an embodiment of the application, two opposite ends of the adjustable fixing assembly are slidably disposed at the pair of extending portions. The adjustable fixing assembly is adapted to be subjected to an external force to move in a first sliding direction away from the front element. When the external force is removed from the adjustable fixing assembly that has been moved in the first sliding direction, the adjustable fixing assembly is adapted to move in a second sliding direction opposite to the first sliding direction.

In an embodiment of the application, the two opposite ends of the rear adjustable fixing assembly are slidably disposed at the pair of protruding portions. The rear adjustable fixing assembly includes a rotatable adjusting mechanism adapted to rotate in a first rotation direction. The rear adjustable fixing assembly is adapted to move in a first translational direction perpendicular to the first rotation direction due to rotation of the rotatable adjusting mechanism in the first rotation direction. When the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

A head-mounted display device of the application includes a front element, a pair of extending portions, an adjustable fixing assembly, and a rear adjustable fixing assembly. The front element is adapted to be placed or be installed with a display device. The pair of extending portions is respectively connected to two opposite ends of the front element. Two opposite ends of the adjustable fixing assembly are connected to the pair of extending portions. The rear adjustable fixing assembly includes a rotatable adjusting mechanism. Two opposite ends of the rear adjustable fixing assembly are slidably disposed at the two opposite ends of the adjustable fixing assembly. The rotatable adjusting mechanism is adapted to rotate in a first rotation direction, and the rear adjustable fixing assembly is adapted to move in a first translational direction perpendicular to the first rotation direction due to rotation of the rotatable adjusting mechanism in the first rotation direction. When the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

In an embodiment of the application, the rear adjustable fixing assembly further includes a moving member. Two opposite ends of the moving member are slidably disposed at the two opposite ends of the adjustable fixing assembly. The rotatable adjusting mechanism is rotatably disposed in the moving member.

In an embodiment of the application, when the rotatable adjusting mechanism is rotated in the first rotation direction, the moving member is adapted to move in the first translational direction due to rotation of the rotatable adjusting mechanism in the first rotation direction. When the rotatable adjusting mechanism is rotated in the second rotation direction, the moving member is adapted to move in the second translational direction.

In an embodiment of the application, the moving member includes a rear slide groove, and the rear adjustable fixing assembly further includes a pair of adjusting members movably disposed in the rear slide groove. Each of the pair of adjusting members has a fixing end and a moving end opposite to each other. The fixing ends of the pair of adjusting members are fixed to the two opposite ends of the adjustable fixing assembly. The moving ends of the pair of adjusting members are overlapped with each other. The rotatable adjusting mechanism is coupled to the moving ends of the adjusting members.

In an embodiment of the application, the moving end of the adjusting member includes a gear rack, the rotatable adjusting mechanism includes a gear, and the gear racks of the pair of adjusting members are engaged with the gear of the rotatable adjusting mechanism.

In an embodiment of the application, two opposite side surfaces of the rear adjustable fixing assembly respectively include a first ratchet and a second ratchet, and the rotatable adjusting mechanism includes an adjusting knob and a driving member. The adjusting knob includes a rotation portion, a first propping portion, and a second propping portion. The rotation portion is rotatably disposed on the rear adjustable fixing assembly. The first propping portion is connected to the rotation portion. The second propping portion is connected to the rotation portion. The driving member is rotatably disposed on the adjusting knob. The driving member includes a body portion, a first engagement portion, and a second engagement portion. The first propping portion is adapted to actuate the first engagement portion to move in a direction away from the first ratchet. The second propping portion is adapted to actuate the second engagement portion to move in a direction away from the second ratchet. When the adjusting knob is rotated in the second rotation direction, the adjusting knob drives the driving member to rotate in the second rotation direction, the second propping portion actuates the second engagement portion to move in the direction away from the second ratchet, the first propping portion does not actuate the first engagement portion, and the first engagement portion generates ratchet wheel actuation on the first ratchet.

In an embodiment of the application, when the adjusting knob is rotated in the first rotation direction, the adjusting knob drives the driving member to rotate in the first rotation direction, the first propping portion actuates the first engagement portion to move in the direction away from the first ratchet, the second propping portion does not actuate the second engagement portion, and the second engagement portion generates ratchet wheel actuation on the second ratchet.

In an embodiment of the application, the rear adjustable fixing assembly includes a pair of gear racks, the driving member further includes a gear, and the pair of gear racks is respectively engaged with the gear. When the adjusting knob is rotated in the first rotation direction, the adjusting knob drives the gear to rotate in the first rotation direction, and the gear drives the pair of gear racks to move to allow the rear adjustable fixing assembly to move in the first translational direction. When the adjusting knob is rotated in the second rotation direction, the adjusting knob drives the gear to rotate in the second rotation direction, and the gear drives the pair of gear racks to move to allow the rear adjustable fixing assembly to move in the second translational direction.

In an embodiment of the application, the head-mounted display device further includes an elastic cover member fixed to the rear adjustable fixing assembly. The elastic cover member is adapted to be subjected to a propping force to move in a first movement direction, and two opposite ends of the elastic cover member are adapted to move in directions toward each other due to the propping force. When the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

In an embodiment of the application, the elastic cover member includes a first fold line and a second fold line. Two opposite ends of the first fold line are respectively connected to two opposite ends of the second fold line. A gap is present between the first fold line and the second fold line.

Accordingly, in the head-mounted display device of the embodiments of the application, the front element is adapted to be placed or be installed with a display device and is adapted to cover eyes of a user. The pair of extending portions are respectively connected to the two opposite ends of the front element. The two opposite ends of the adjustable fixing assembly are slidably disposed at the pair of extending portions. The adjustable fixing assembly is adapted to be subjected to the external force to move in the first sliding direction away from the front element. When the external force is removed from the adjustable fixing assembly that has been moved in the first sliding direction, the adjustable fixing assembly is adapted to move in the second sliding direction opposite to the first sliding direction. Accordingly, the head-mounted display device is adapted to head shapes of different users, and the adjustable fixing assembly is easy to adjust and operate.

On the other hand, in the head-mounted display device of the embodiments of the application, the front element is adapted to cover the eyes of the user. The pair of extending portions are respectively connected to the two opposite ends of the front element. The adjustable fixing assembly includes the frame. The two opposite ends of the body portion of the frame are connected to the pair of extending portions. The pair of protruding portions are respectively connected to the two opposite ends of the body portion. The top adjustable fixing assembly is adapted to be in contact with a parietal bone of the user. The two opposite ends of the top adjustable fixing assembly are connected to the body portion. The rear adjustable fixing assembly is adapted to be in contact with an occipital bone of the user. The two opposite ends of the rear adjustable fixing assembly are connected to the pair of protruding portions. The included angle is present between the body portion and the protruding portion. Therefore, the front element, the top adjustable fixing assembly, and the rear adjustable fixing assembly may be respectively in contact with the user's eyes, parietal bone, and occipital bone. By increasing the number of contact positions between the head-mounted display device and the user's head, the head-mounted display device is more securely mounted on the user's head and does not fall off easily. Moreover, a pressure applied by the head-mounted display device on the user's head is distributed to a plurality of contact positions, which enhances comfort for the user to wear the head-mounted display device.

In addition, in the head-mounted display device of the embodiments of the application, the front element is adapted to cover the eyes of the user. The pair of extending portions are respectively connected to the two opposite ends of the front element. The two opposite ends of the adjustable fixing assembly are connected to the pair of extending portions. The rear adjustable fixing assembly is adapted to be in contact with the occipital bone of the user and include the rotatable adjusting mechanism. The two opposite ends of the rear adjustable fixing assembly are slidably disposed at the two opposite ends of the adjustable fixing assembly. The rotatable adjusting mechanism is adapted to rotate in the first rotation direction. The rear adjustable fixing assembly is adapted to move in the first translational direction perpendicular to the first rotation direction due to rotation of the rotatable adjusting mechanism in the first rotation direction. When the rotatable adjusting mechanism is rotated in the second rotation direction opposite to the first rotation direction, the rear adjustable fixing assembly is adapted to move in the second translational direction opposite to the first translational direction due to rotation of the rotatable adjusting mechanism in the second rotation direction. Accordingly, the rear adjustable fixing assembly may be in contact with the occipital bone of the user and is easy to adjust, such that the head-mounted display device is adapted to head shapes of different users.

To provide a further understanding of the aforementioned and other features and advantages of the application, exemplary embodiments, together with the reference drawings, are described in detail below.

BRIEF DESCRIPTION OF THE DRAWINGS

FIG. 5C and FIG. 5D are schematic diagrams illustrating actuations of the rear adjustable fixing assembly of FIG. 5A.

DESCRIPTION OF THE EMBODIMENTS

Figure 1A:
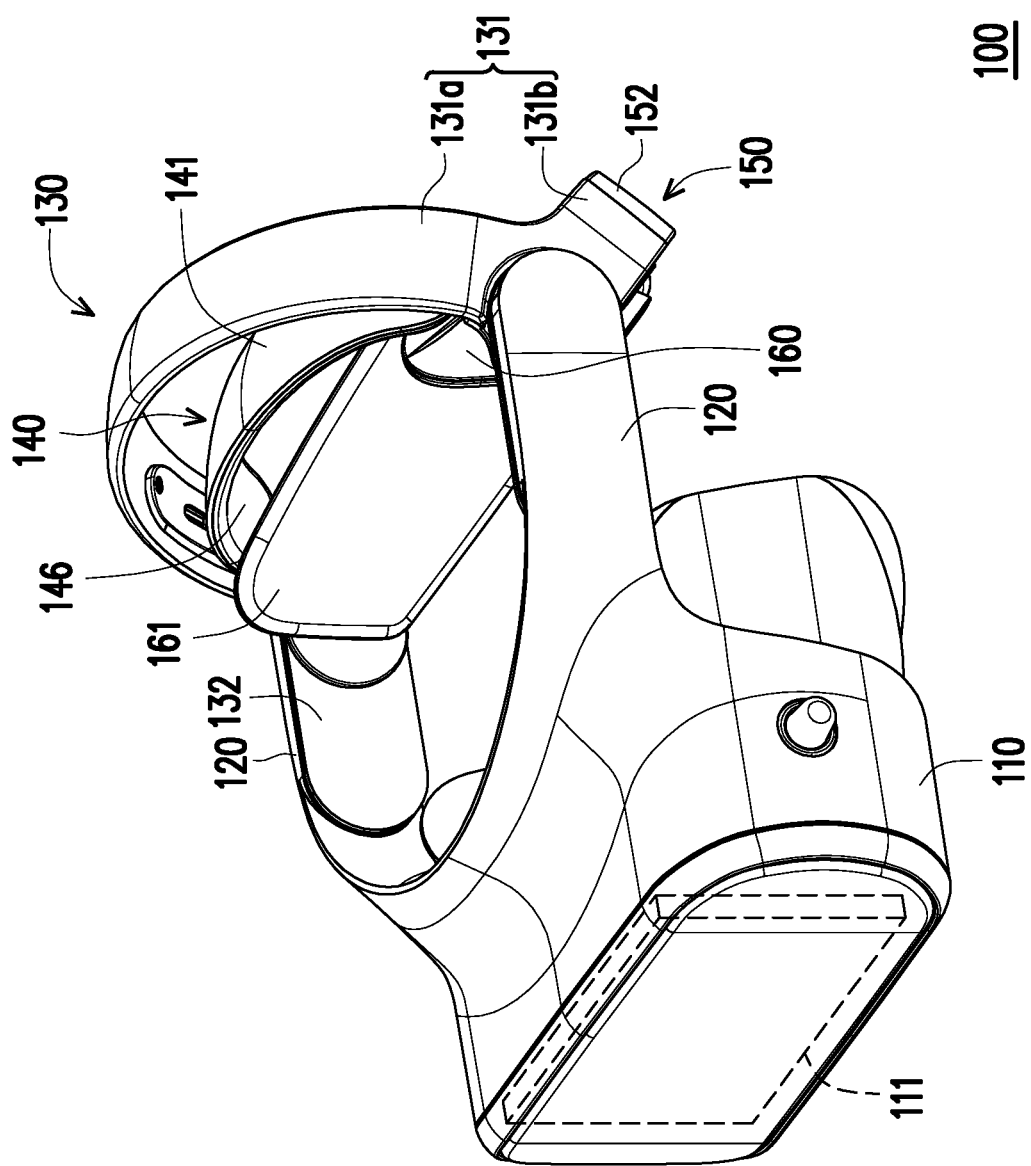
FIG. 1A is a perspective schematic diagram illustrating a head-mounted display device according to an embodiment of the application.

FIG. 1A is a perspective schematic diagram illustrating a head-mounted display device according to an embodiment of the application. Referring to FIG. 1A, a head-mounted display device 100 includes a front element 110, a pair of extending portions 120, and an adjustable fixing assembly 130. The front element 110 covers eyes of a user, includes components including an optical system (not illustrated) and a protective casing. The front element 110 is placed a display device 111 or is adapted to be installed with a display device 111. The display device 111 may be a built-in display device or an externally mounted portable display device (e.g., a smartphone), but the application is not limited hereto. The type of the display device 111 may be adjusted according to the application of the head-mounted display device 100 to a virtual reality system, an augmented reality system, or a mixed reality system. The optical system includes an optical element (e.g., a lens, a light guide, or a prism) configured to change an optical path from the display, but the application is not limited hereto.

Figure 1B:
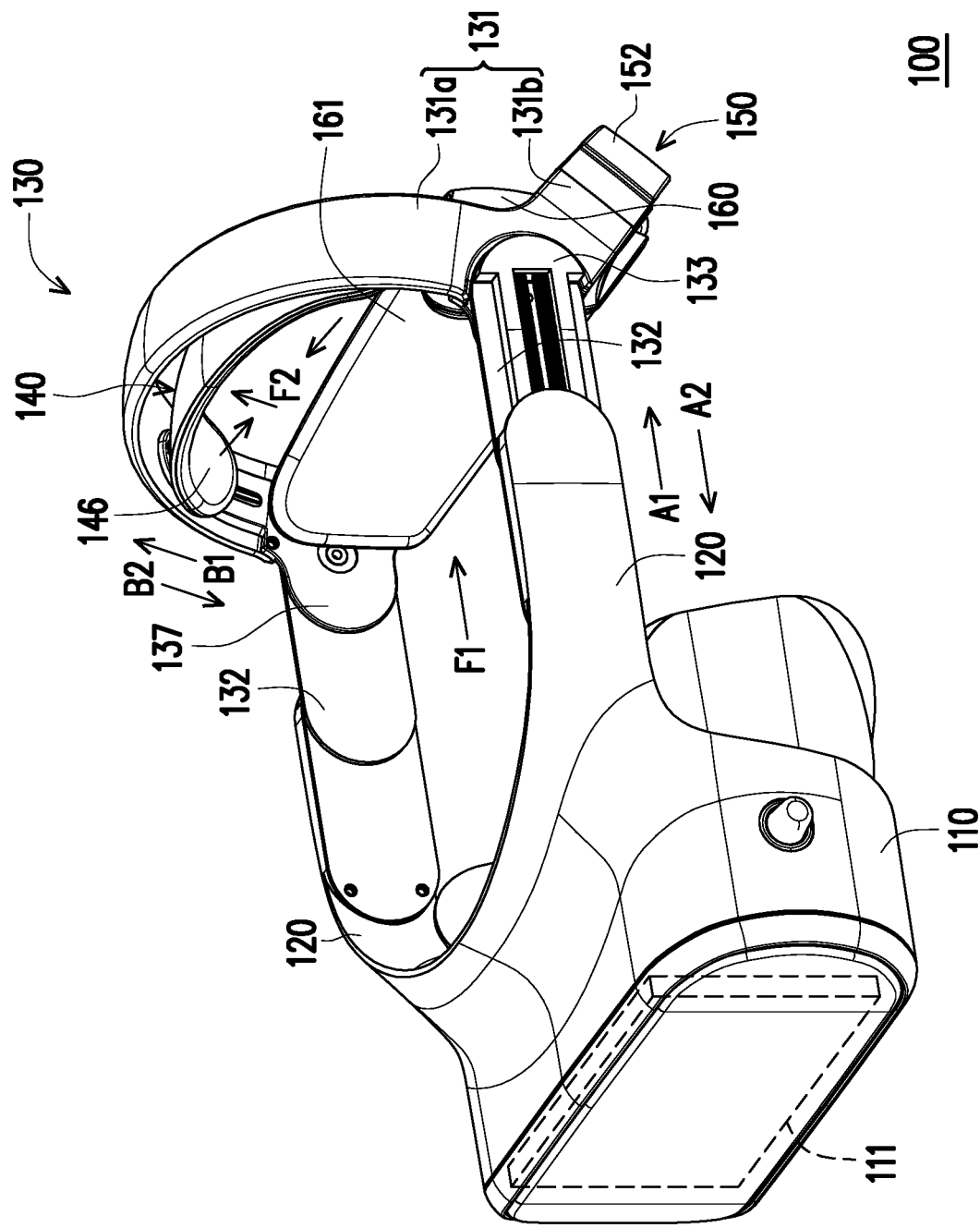
FIG. 1B is a perspective schematic diagram illustrating the head-mounted display device of FIG. 1A after being subjected to an external force, an acting force, and a propping force.

FIG. 1B is a perspective schematic diagram illustrating the head-mounted display device of FIG. 1A after being subjected to an external force, an acting force, and a propping force. Referring to FIG. 1A and FIG. 1B, a first implementation aspect of the head-mounted display device 100 is described here. The pair of extending portions 120 of the head-mounted display device 100 is respectively connected to two opposite ends of the front element 110. Two opposite ends of the adjustable fixing assembly 130 are slidably disposed at the pair of extending portions 120. The adjustable fixing assembly 130 may be subjected to an external force F1 to move in a first sliding direction A1 away from the front element 110. When the external force F1 is removed from the adjustable fixing assembly 130 that has been moved in the first sliding direction A1, the adjustable fixing assembly 130 may be moved in a second sliding direction A2 opposite to the first sliding direction A1. In other words, after the adjustable fixing assembly 130 is moved in the first sliding direction A1 due to the external force F1, an internal space of the head-mounted display device 100 is increased accordingly and may be adapted to a larger head shape. At this time, the head-mounted display device 100 with the increased internal space may be fit around the user's head. After the external force F1 is removed and the adjustable fixing assembly 130 is moved in the second sliding direction A2, the internal space of the head-mounted display device 100 is decreased accordingly, and the head-mounted display device 100 is closely fit around the user's head. Accordingly, the head-mounted display device 100 is adapted to head shapes of different users, and the adjustable fixing assembly 130 is easy to adjust and operate.

Figure 2A:
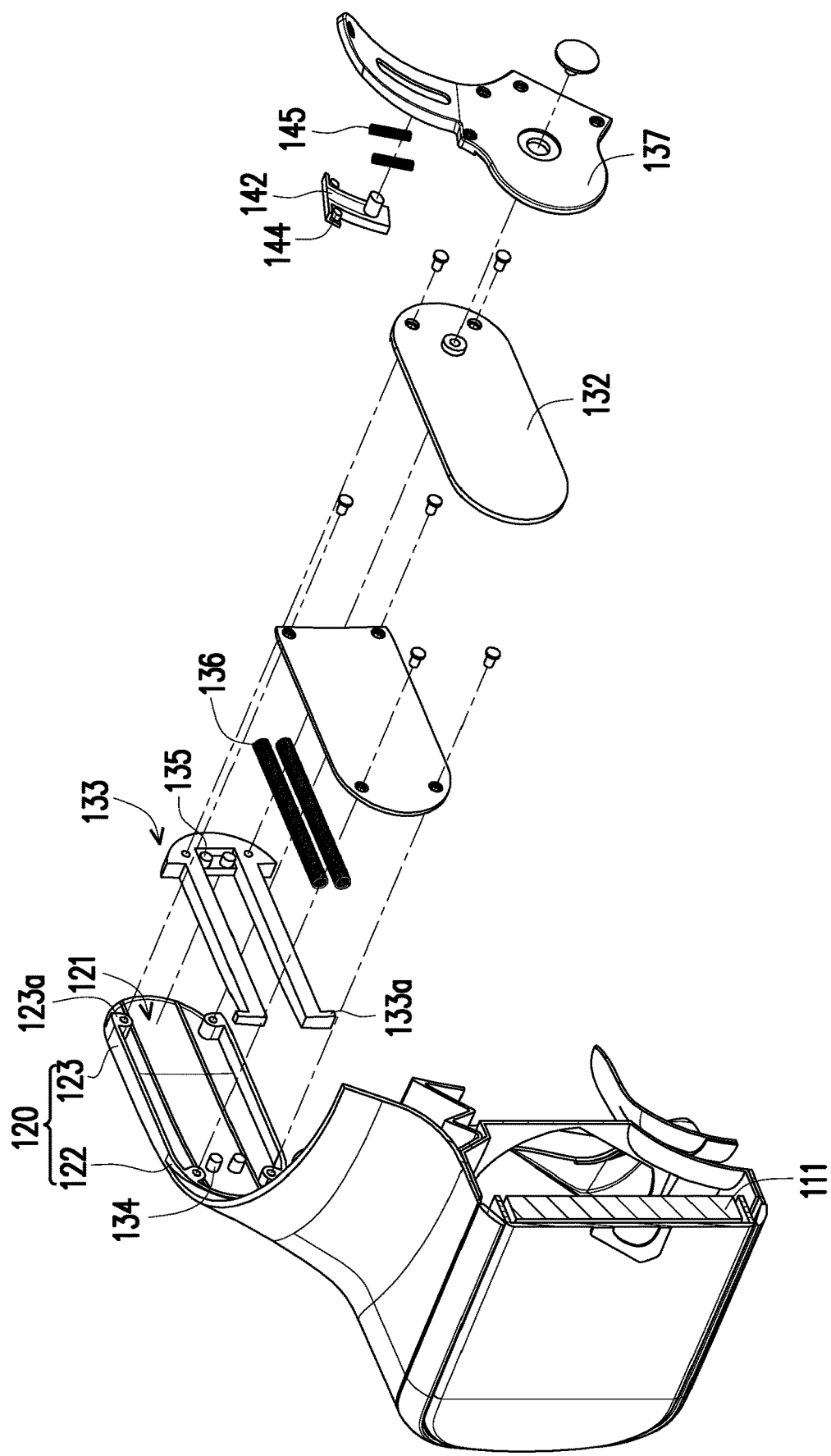
FIG. 2A to FIG. 2D are exploded views illustrating the head-mounted display device of FIG. 1A.

FIG. 2A to FIG. 2D are exploded views illustrating the head-mounted display device of FIG. 1A. FIG. 3 is a cross-sectional schematic diagram illustrating the head-mounted display device of FIG. 1A. To facilitate illustration and description, FIG. 2A shows a half-sectional view of the front element 110. Referring to FIG. 1B, FIG. 2A, and FIG. 3, specifically, the adjustable fixing assembly 130 includes a frame 131 and a pair of connection members 132. The pair of connection members 132 is respectively connected to two opposite ends of the frame 131, and the pair of connection members 132 is slidably disposed on the pair of extending portions 120. To avoid redundancy of description, one of the pair of extending portions 120 and one of the pair of connection members 132 are described below. Specifically, the extending portion 120 has a slide groove 121. The adjustable fixing assembly 130 including a sliding member 133, first fixing portions 134, second fixing portions 135, and restoring members 136. Here, one first fixing portion 134, one second fixing portion 135, and one restoring member 136 are described, but their numbers are not limited in the application. The sliding member 133 is fixed on the connection member 132 and is slidably disposed in the slide groove 121 of the extending portion 120. The first fixing portion 134 is disposed in the slide groove 121. The second fixing portion 135 is disposed on the sliding member 133. The restoring member 136 is, for example, an expansion spring, and two opposite ends of the restoring member 136 are respectively fixed to the first fixing portion 134 located in the slide groove 121 and the second fixing portion 135 located on the sliding member 133. On the other hand, the extending portion 120 has a first end 122 and a second end 123 opposite to each other. The second end 123 of the extending portion 120 includes a first stop portion 123a. The sliding member 133 includes a second stop portion 133a corresponding to the first stop portion 123a. With the first stop portion 123a blocking the second stop portion 133a, the second stop portion 133a may be reciprocatingly moved between the first end 122 and the second end 123 of the extending portion 120.

In other words, after the adjustable fixing assembly 130 is subjected to the external force F1, the sliding member 133 is moved in the slide groove 121 in the first sliding direction A1, and the first stop portion 123a blocks the second stop portion 133a from continuing to move in the first sliding direction A1 to prevent the sliding member 133 from sliding out of the slide groove 121. When the external force F1 is removed from the adjustable fixing assembly 130 that has been moved in the first sliding direction A1, the sliding member 133 is moved in the second sliding direction A2 by a pull force of the restoring members 136. In other words, after the sliding member 133 is moved in the first sliding direction A1, the internal space of the head-mounted display device 100 is increased accordingly and may be adapted to a larger head shape. At this time, the head-mounted display device 100 with the increased internal space may be fit around the user's head. After the external force F1 is removed and the sliding member 133 is moved in the second sliding direction A2, the internal space of the head-mounted display device 100 is decreased accordingly, and the head-mounted display device 100 is closely fit around the user's head. Accordingly, the head-mounted display device 100 is adapted to head shapes of different users, and the adjustable fixing assembly 130 is easy to adjust and operate.

Figure 2B:
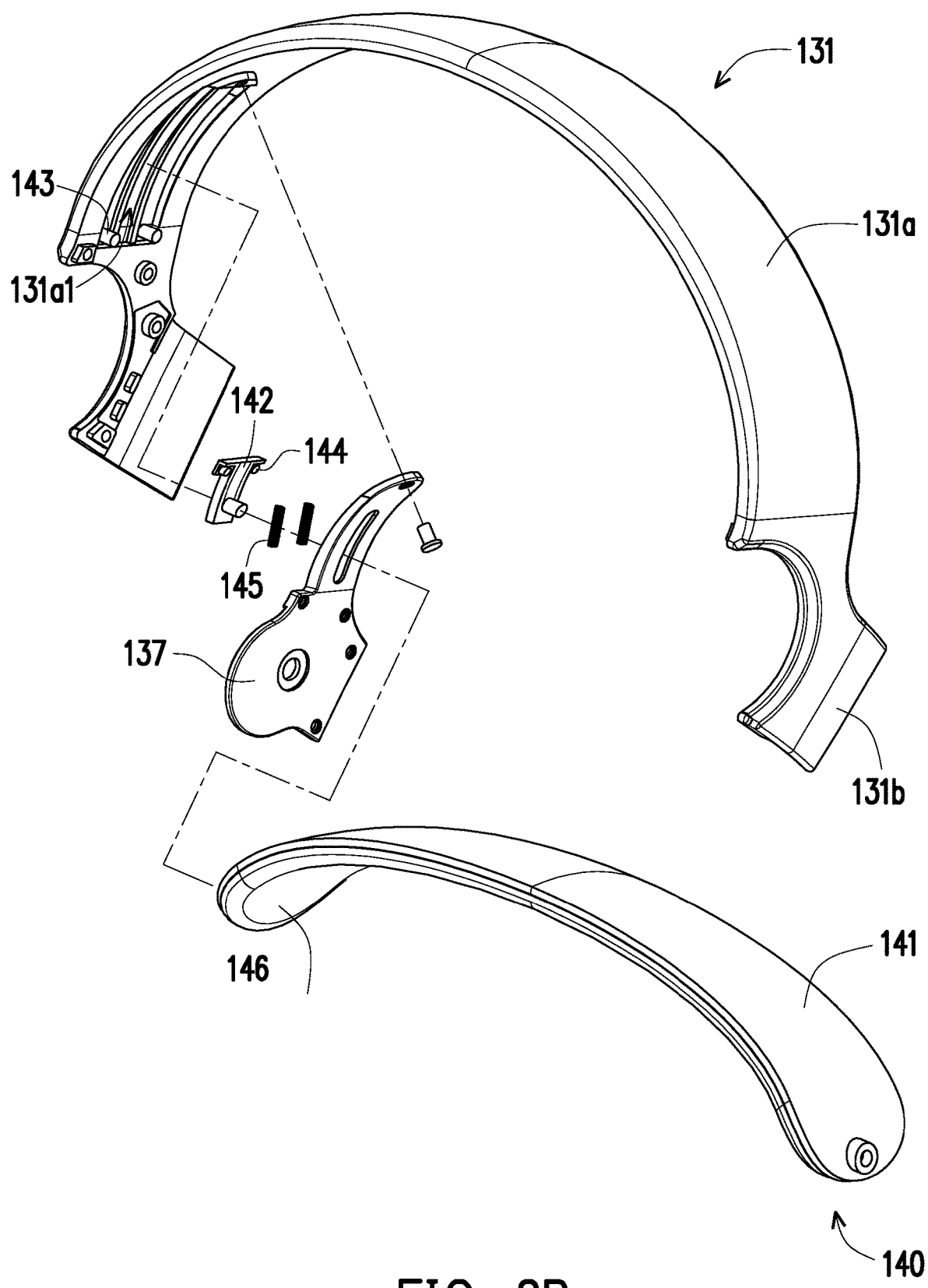
Figure 3:
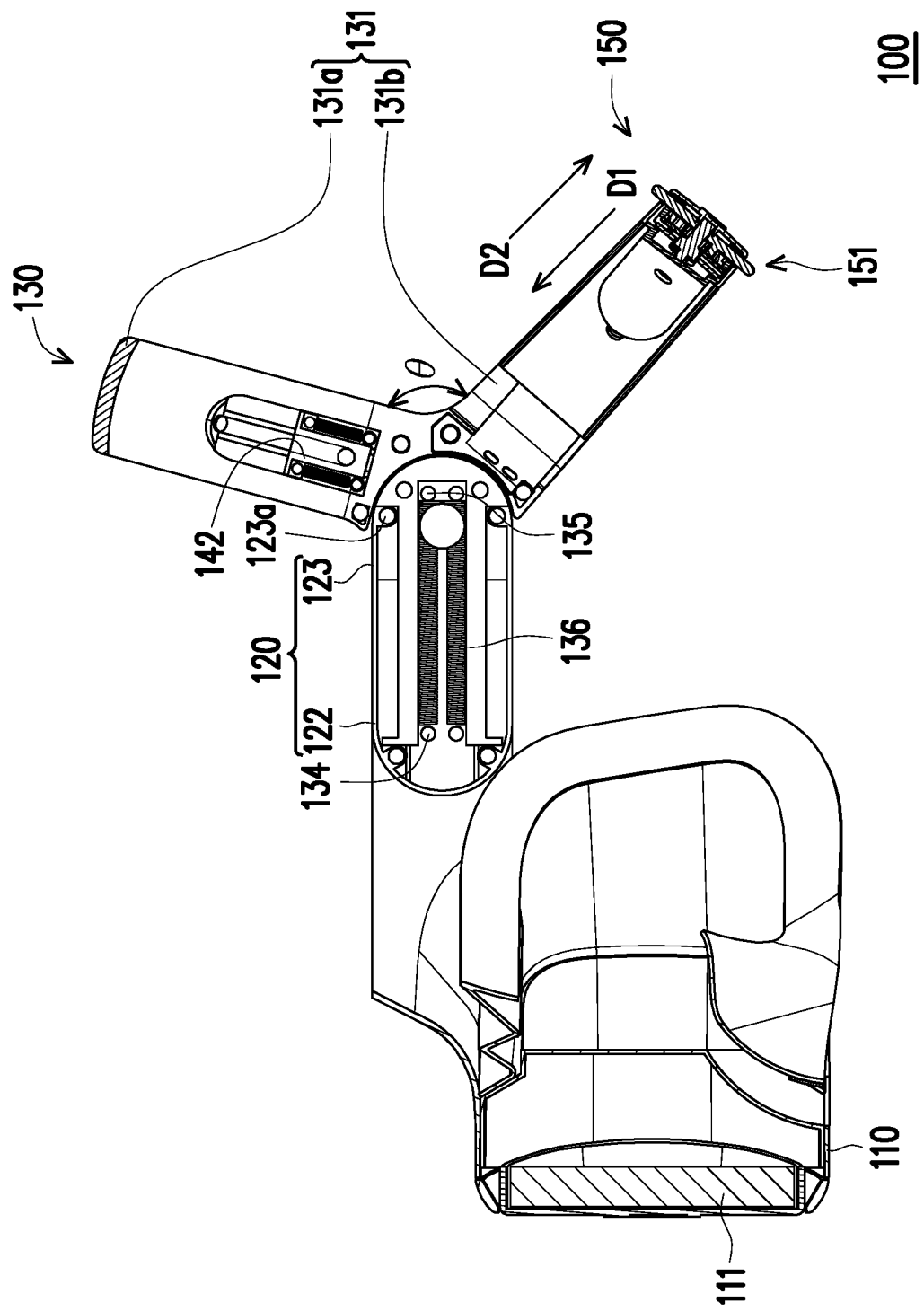
FIG. 3 is a cross-sectional schematic diagram illustrating the head-mounted display device of FIG. 1A.

Referring to FIG. 1B, FIG. 2A, and FIG. 2B, in the first implementation aspect of the head-mounted display device 100, the two opposite ends of the frame 131 are rotatably disposed at the connection members 132. For example, the adjustable fixing assembly 130 further includes a pivot member 137 fixed at each of the two opposite ends of the frame 131, and the frame 131 is rotatably disposed at the connection members 132 via the pivot members 137. This configuration makes it convenient for the user to fine-tune an angle of the adjustable fixing assembly 130 so that the adjustable fixing assembly 130 can be in better contact with the user's head.

Referring to FIG. 1A, FIG. 1B, and FIG. 2B, in the first implementation aspect of the head-mounted display device 100, the head-mounted display device 100 may further include a top adjustable fixing assembly 140. The top adjustable fixing assembly 140 may be in contact with a parietal bone of the user's head. Two opposite ends of the top adjustable fixing assembly 140 are slidably disposed at the adjustable fixing assembly 130. The top adjustable fixing assembly 140 may be subjected to an acting force F2 to move in a first deviation direction B1. The two opposite ends of the top adjustable fixing assembly 140 may be moved in directions toward each other due to the acting force F2. When the acting force F2 is removed from the top adjustable fixing assembly that has been moved in the first deviation direction B1, the top adjustable fixing assembly 140 may be moved in a second deviation direction B2 opposite to the first deviation direction B1, and the two opposite ends of the top adjustable fixing assembly 140 may be moved in directions away from each other. By fine-tuning the top adjustable fixing assembly 140, the head-mounted display device 100 may be in better contact with the parietal bone of the user's head. Accordingly, the head-mounted display device 100 is adapted to head shapes of different users, and the top adjustable fixing assembly 140 is easy to adjust and operate. It is noted that, in the first implementation aspect of the head-mounted display device 100, it is also possible that the top adjustable fixing assembly 140 is not disposed.

Figure 4A:
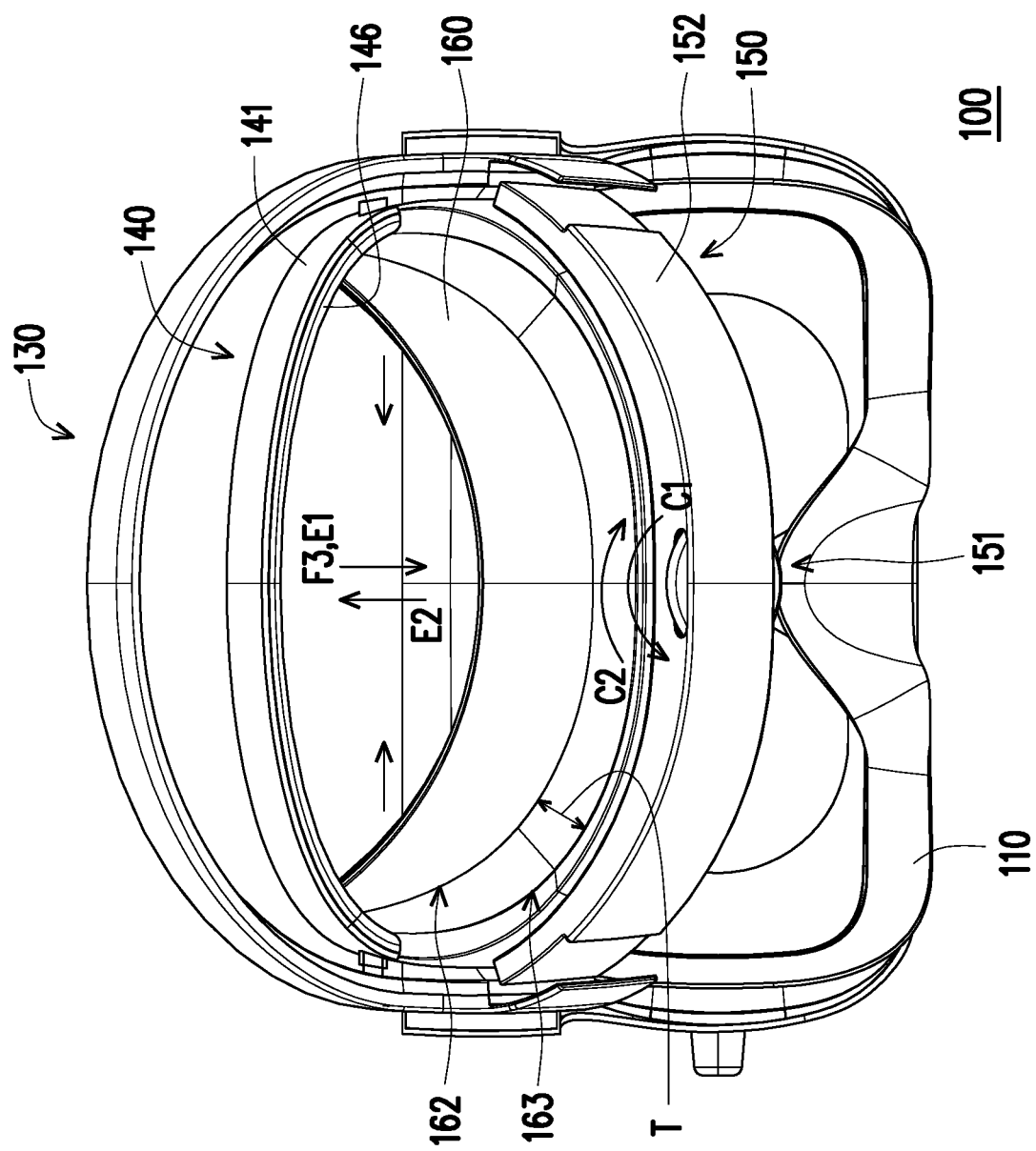
FIG. 4A is a rear-view schematic diagram illustrating the head-mounted display device of FIG. 1A.

FIG. 4A is a rear-view schematic diagram illustrating the head-mounted display device of FIG. 1A. Referring to FIG. 1B, FIG. 3, and FIG. 4A, in the first implementation aspect of the head-mounted display device 100, the head-mounted display device 100 may further include a rear adjustable fixing assembly 150. The rear adjustable fixing assembly 150 may be in contact with an occipital bone of the user's head. The rear adjustable fixing assembly 150 includes a rotatable adjusting mechanism 151. Two opposite ends of the rear adjustable fixing assembly 150 are slidably disposed at the adjustable fixing assembly 130. The rotatable adjusting mechanism 151 is rotatable in a first rotation direction C1. The rear adjustable fixing assembly 150 may be moved in a first translational direction D1 perpendicular to the first rotation direction C1 due to rotation of the rotatable adjusting mechanism 151 in the first rotation direction C1. When the rotatable adjusting mechanism 151 is rotated in a second rotation direction C2 opposite to the first rotation direction C1, the rear adjustable fixing assembly 150 may be moved in a second translational direction D2 opposite to the first translational direction D1 due to rotation of the rotatable adjusting mechanism 151 in the second rotation direction C2. For example, the first translational direction D1 is a direction toward the front element 110. In other words, through the rotatable adjusting mechanism 151, the rear adjustable fixing assembly 150 is moved close to the front element 110, which decreases the internal space of the head-mounted display device 100. By fine-tuning the rear adjustable fixing assembly 150, the head-mounted display device 100 may be in better contact with the occipital bone of the user's head. Accordingly, the head-mounted display device 100 is adapted to head shapes of different users, and the rear adjustable fixing assembly 150 is easy to adjust and operate. It is noted that, in the first implementation aspect of the head-mounted display device 100, it is also possible that the rear adjustable fixing assembly 150 is not disposed.

Figure 2C:
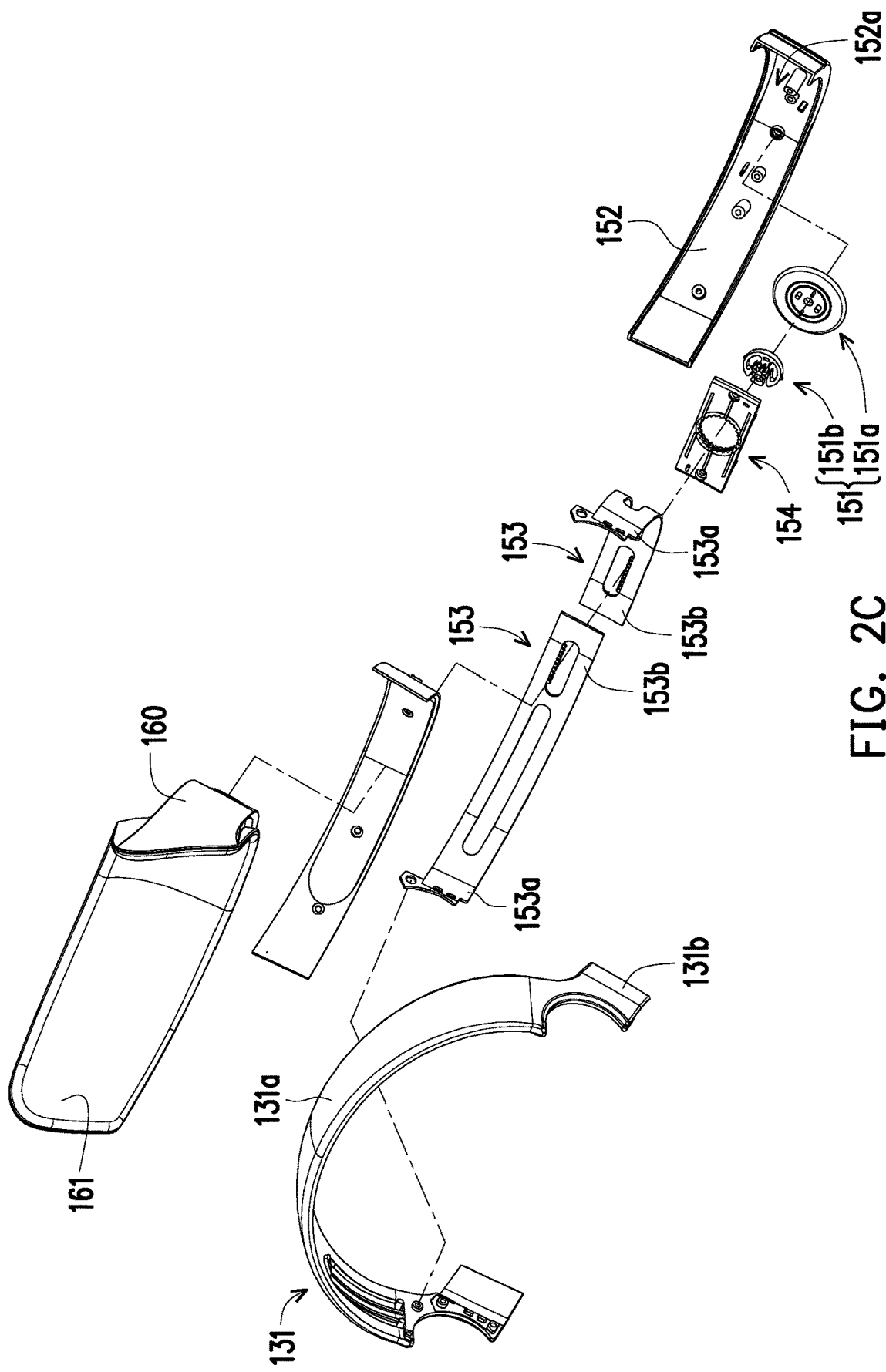

Referring to FIG. 1A, FIG. 2C, and FIG. 4A, in the first implementation aspect of the head-mounted display device 100, the head-mounted display device 100 may further include an elastic cover member 160. The elastic cover member 160 may be in contact with the occipital bone of the user's head, and a material of the elastic cover member 160 is, for example, thermoplastic polyurethanes (TPU). The elastic cover member 160 is fixed to the adjustable fixing assembly 130. The elastic cover member 160 may be subjected to a propping force F3 to move in a first movement direction E1. Moreover, two opposite ends of the elastic cover member 160 may be moved in directions toward each other due to the propping force F3 to cover the occipital bone of the user's head. When the propping force F3 is removed from the elastic cover member 160 that has been moved in the first movement direction E1, the elastic cover member 160 may be moved in a second movement direction E2 opposite to the first movement direction E1, and the two opposite ends of the elastic cover member 160 may be moved in directions away from each other. For example, the first movement direction E1 is a direction away from the front element 110. By fine-tuning the elastic cover member 160, the head-mounted display device 100 may be in better contact with the occipital bone of the user's head. Accordingly, the head-mounted display device 100 is adapted to head shapes of different users, and the elastic cover member 160 is easy to adjust and operate. It is noted that, in the first implementation aspect of the head-mounted display device 100, it is also possible that the elastic cover member 160 is not disposed and is replaced with a general cushion.

Referring to FIG. 1A and FIG. 3, a second implementation aspect of the head-mounted display device 100 is described here. The head-mounted display device 100 includes a front element 110, a pair of extending portions 120, an adjustable fixing assembly 130, a top adjustable fixing assembly 140, and a rear adjustable fixing assembly 150. The front element 110 may cover eyes of a user. The pair of extending portions 120 is respectively connected to two opposite ends of the front element 110. The adjustable fixing assembly 130 includes a frame 131. The frame 131 includes a body portion 131a and a pair of protruding portions 131b. Two opposite ends of the body portion 131a are connected to the pair of extending portions 120. The pair of protruding portions 131b is respectively connected to the two opposite ends of the body portion 131a. The top adjustable fixing assembly 140 may be in contact with a parietal bone of the user's head, and two opposite ends of the top adjustable fixing assembly 140 are connected to the body portion 131a of the frame 131. The rear adjustable fixing assembly 150 may be in contact with an occipital bone of the user's head, and two opposite ends of the rear adjustable fixing assembly 150 are connected to the protruding portions 131b of the frame 131. An included angle θ is present between the body portion 131a and the protruding portion 131b. Viewed from a viewing angle of FIG. 3, a shape of the body portion 131a and the protruding portion 131b of the frame 131 is similar to an L-shape. In other words, the included angle θ is also present between the top adjustable fixing assembly 140 disposed at the body portion 131a and the rear adjustable fixing assembly 150 disposed at the protruding portions 131b. An adjusting mechanism (e.g., a hinge, a spring mechanism, or a pivot structure) may be disposed between the top adjustable fixing assembly 140 and the rear adjustable fixing assembly 150 disposed at the protruding portions 131b. Through the adjusting mechanism, the included angle θ between the top adjustable fixing assembly 140 and the rear adjustable fixing assembly 150 disposed at the protruding portions 131b may be changed and adjusted. Accordingly, the top adjustable fixing assembly 140 and the rear adjustable fixing assembly 150 may be respectively in contact with the parietal bone and the occipital bone of the user's head, and the front element 110 may cover the eyes of the user. Therefore, the front element 110, the top adjustable fixing assembly 140, and the rear adjustable fixing assembly 150 may be respectively in contact with the user's eyes, parietal bone, and occipital bone. By increasing the number of contact positions between the head-mounted display device 100 and the user's head, the head-mounted display device 100 is more securely mounted on the user's head and does not fall off easily. Moreover, a pressure applied by the head-mounted display device 100 on the user's head is distributed to a plurality of contact positions, which enhances comfort for the user to wear the head-mounted display device 100.

For example, the included angle θ ranges from 30° to 150° to allow the top adjustable fixing assembly 140 and the rear adjustable fixing assembly 150 to be in better contact with the parietal bone and the occipital bone of the user's head. The included angle may be adjusted by the user to create more comfortable contact for the parietal bone and the occipital bone of the user's head.

Referring to FIG. 1A, FIG. 1B, and FIG. 2B, in the second implementation aspect of the head-mounted display device 100, the two opposite ends of the top adjustable fixing assembly 140 are slidably disposed at the adjustable fixing assembly 130. The top adjustable fixing assembly 140 may be subjected to an acting force F2 to move in a first deviation direction B1. The two opposite ends of the top adjustable fixing assembly 140 may be moved in directions toward each other due to the acting force F2. When the acting force F2 is removed from the top adjustable fixing assembly that has been moved in the first deviation direction B1, the top adjustable fixing assembly 140 may be moved in a second deviation direction B2 opposite to the first deviation direction B1, and the two opposite ends of the top adjustable fixing assembly may be moved in directions away from each other. By fine-tuning the top adjustable fixing assembly 140, the head-mounted display device 100 may be in better contact with the parietal bone of the user's head. Accordingly, the head-mounted display device 100 is adapted to head shapes of different users, and the top adjustable fixing assembly 140 is easy to adjust and operate. It is noted that, in the second implementation aspect of the head-mounted display device 100, it is also possible that the top adjustable fixing assembly 140 is simply fixed to the adjustable fixing assembly 130.

Specifically, referring to FIG. 1B, FIG. 2B, and FIG. 3, the body portion 131a has a top slide groove 131a1. The top adjustable fixing assembly 140 includes a flexible body 141, a top sliding member 142, first top fixing portions 143, second top fixing portions 144, and top restoring members 145. Here, one first top fixing portion 143, one second top fixing portion 144, and one top restoring member 145 are described, but their numbers are not limited in the application. The top sliding member 142 is fixed to the flexible body 141 and is slidably disposed in the top slide groove 131a1. Therefore, the top sliding member 142 and the flexible body 141 may be moved simultaneously. The first top fixing portion 143 is disposed in the top slide groove 131a1. The second top fixing portion 144 is disposed on the top sliding member 142. The top restoring member 145 is, for example, an expansion spring, and two opposite ends of the top restoring member 145 are respectively fixed to the first top fixing portion 143 and the second top fixing portion 144.

In other words, after the top adjustable fixing assembly 140 is subjected to the acting force F2, the top sliding member 142 may be moved in the top slide groove 131a1 in the first deviation direction B1. When the acting force F2 is removed from the top adjustable fixing assembly 140 that has been moved in the first deviation direction B1, the top sliding member 142 may be moved in the second deviation direction B2 by a pull force of the top restoring members 145.

More specifically, the top adjustable fixing assembly 140 further includes a buffer material layer 146 that is disposed on the flexible body 141 and is adapted to be in contact with the parietal bone of the user's head. A material of the flexible body 141 is, for example, thermoplastic polyurethanes (TPU). The flexible body 141 may be subjected to the acting force F2 to move in the first deviation direction B1. The two opposite ends of the flexible body 141 may be moved in directions toward each other due to the acting force F2 to cover the parietal bone of the user's head. When the acting force F2 is removed from the flexible body 141 that has been moved in the first deviation direction B1, the flexible body 141 may be moved in the second deviation direction B2, and the two opposite ends of the flexible body 141 may be moved in directions away from each other. By fine-tuning the top adjustable fixing assembly 140, the head-mounted display device 100 may be in better contact with the parietal bone of the user's head. Accordingly, the head-mounted display device 100 is adapted to head shapes of different users, and the top adjustable fixing assembly 140 is easy to adjust and operate. It is noted that, in the second implementation aspect of the head-mounted display device 100, it is also possible that the top adjustable fixing assembly 140 is simply fixed to the adjustable fixing assembly 130.

Referring to FIG. 1A, FIG. 2C, and FIG. 4A, in the second implementation aspect of the head-mounted display device 100, the head-mounted display device 100 may further include an elastic cover member 160. The elastic cover member 160 may be in contact with the occipital bone of the user's head, and the elastic cover member 160 is fixed to the rear adjustable fixing assembly 150. A material of the elastic cover member 160 is, for example, thermoplastic polyurethanes (TPU). Specifically, the elastic cover member 160 includes a soft material layer 161 that may be in contact with the parietal bone of the user's head. The elastic cover member 160 may be subjected to a propping force F3 to move in a first movement direction E1. Moreover, two opposite ends of the elastic cover member 160 may be moved in directions toward each other due to the propping force F3 to cover the occipital bone of the user's head. When the propping force F3 is removed from the elastic cover member 160 that has been moved in the first movement direction E1, the elastic cover member 160 may be moved in a second movement direction E2 opposite to the first movement direction E1, and the two opposite ends of the elastic cover member 160 may be moved in directions away from each other. For example, the first movement direction E1 is a direction away from the front element 110. By fine-tuning the elastic cover member 160, the head-mounted display device 100 may be in better contact with the occipital bone of the user's head. Accordingly, the head-mounted display device 100 is adapted to head shapes of different users, and the elastic cover member 160 is easy to adjust and operate. It is noted that, in the second implementation aspect of the head-mounted display device 100, it is also possible that the elastic cover member 160 is not disposed and is replaced with a general cushion.

Referring to FIG. 1A and FIG. 1B, in the second implementation aspect of the head-mounted display device 100, two opposite ends of the adjustable fixing assembly 130 are slidably disposed at the pair of extending portions 120. The adjustable fixing assembly 130 may be subjected to an external force F1 to move in a first sliding direction A1 away from the front element 110. When the external force F1 is removed from the adjustable fixing assembly 130 that has been moved in the first sliding direction A1, the adjustable fixing assembly 130 may be moved in a second sliding direction A2 opposite to the first sliding direction A1. In other words, after the adjustable fixing assembly 130 is moved in the first sliding direction A1 due to the external force F1, an internal space of the head-mounted display device 100 is increased accordingly and may be adapted to a larger head shape. At this time, the head-mounted display device 100 with the increased internal space may be fit around the user's head. After the external force F1 is removed and the adjustable fixing assembly 130 is moved in the second sliding direction A2, the internal space of the head-mounted display device 100 is decreased accordingly, and the head-mounted display device 100 is closely fit around the user's head. Accordingly, the head-mounted display device 100 is adapted to head shapes of different users, and the adjustable fixing assembly 130 is easy to adjust and operate.

Referring to FIG. 1B, FIG. 3, and FIG. 4A, in the second implementation aspect of the head-mounted display device 100, the two opposite ends of the rear adjustable fixing assembly 150 are slidably disposed at the pair of protruding portions 131b. The rear adjustable fixing assembly 150 includes a rotatable adjusting mechanism 151. The rotatable adjusting mechanism 151 is rotatable in a first rotation direction C1. The rear adjustable fixing assembly 150 may be moved in a first translational direction D1 perpendicular to the first rotation direction C1 due to rotation of the rotatable adjusting mechanism 151 in the first rotation direction C1. When the rotatable adjusting mechanism 151 is rotated in a second rotation direction C2 opposite to the first rotation direction C1, the rear adjustable fixing assembly 150 may be moved in a second translational direction D2 opposite to the first translational direction D1 due to rotation of the rotatable adjusting mechanism 151 in the second rotation direction C2. For example, the first translational direction D1 is a direction toward the front element 110. In other words, through the rotatable adjusting mechanism 151, the rear adjustable fixing assembly 150 is moved close to the front element 110, which decreases the internal space of the head-mounted display device 100. By fine-tuning the rear adjustable fixing assembly 150, the head-mounted display device 100 may be in better contact with the occipital bone of the user's head. Accordingly, the head-mounted display device 100 is adapted to head shapes of different users, and the rear adjustable fixing assembly 150 is easy to adjust and operate. It is noted that, in the second implementation aspect of the head-mounted display device 100, it is also possible that the rear adjustable fixing assembly 150 is simply fixed to the adjustable fixing assembly 130.

Referring to FIG. 1B, FIG. 3, and FIG. 4A, a third implementation aspect of the head-mounted display device 100 is described here. The head-mounted display device 100 includes a front element 110, a pair of extending portions 120, an adjustable fixing assembly 130, and a rear adjustable fixing assembly 150. The front element 110 may cover eyes of a user. The pair of extending portions 120 is respectively connected to two opposite ends of the front element 110. Two opposite ends of the adjustable fixing assembly 130 are connected to the pair of extending portions 120. The rear adjustable fixing assembly 150 may be in contact with an occipital bone of the user's head. The rear adjustable fixing assembly 150 includes a rotatable adjusting mechanism 151. Two opposite ends of the rear adjustable fixing assembly 150 are slidably disposed at the two opposite ends of the adjustable fixing assembly 130. The rotatable adjusting mechanism 151 is rotatable in a first rotation direction C1. The rear adjustable fixing assembly 150 may be moved in a first translational direction D1 perpendicular to the first rotation direction C1 due to rotation of the rotatable adjusting mechanism 151 in the first rotation direction C1. When the rotatable adjusting mechanism 151 is rotated in a second rotation direction C2 opposite to the first rotation direction C1, the rear adjustable fixing assembly 150 may be moved in a second translational direction opposite to the first translational direction D1 due to rotation of the rotatable adjusting mechanism 151 in the second rotation direction C2. For example, the first translational direction D1 is a direction toward the front element 110. In other words, through the rotatable adjusting mechanism 151, the rear adjustable fixing assembly 150 is moved close to the front element 110, which decreases an internal space of the head-mounted display device 100. By fine-tuning the rear adjustable fixing assembly 150, the head-mounted display device 100 may be in better contact with the occipital bone of the user's head. Accordingly, the head-mounted display device 100 is adapted to head shapes of different users, and the rear adjustable fixing assembly 150 is easy to adjust and operate.

It is noted that, in the third implementation aspect of the head-mounted display device 100, the adjustable fixing assembly 130 may be simply fixed to the extending portions 120 and may also be slidably disposed at the extending portions 120 as in the first implementation aspect of the head-mounted display device 100. Moreover, the specific sliding structure is as described in the first implementation aspect of the head-mounted display device 100 and shall not be repeatedly described here. In addition, in the third implementation aspect of the head-mounted display device 100, the head-mounted display device 100 may further include a top adjustable fixing assembly 140. The top adjustable fixing assembly 140 may be simply fixed to the adjustable fixing assembly 130 and may also be slidably disposed at the adjustable fixing assembly 130 as in the second implementation aspect of the head-mounted display device 100. Moreover, the specific sliding structure is as described in the second implementation aspect of the head-mounted display device 100 and shall not be repeatedly described here.

Figure 5A:
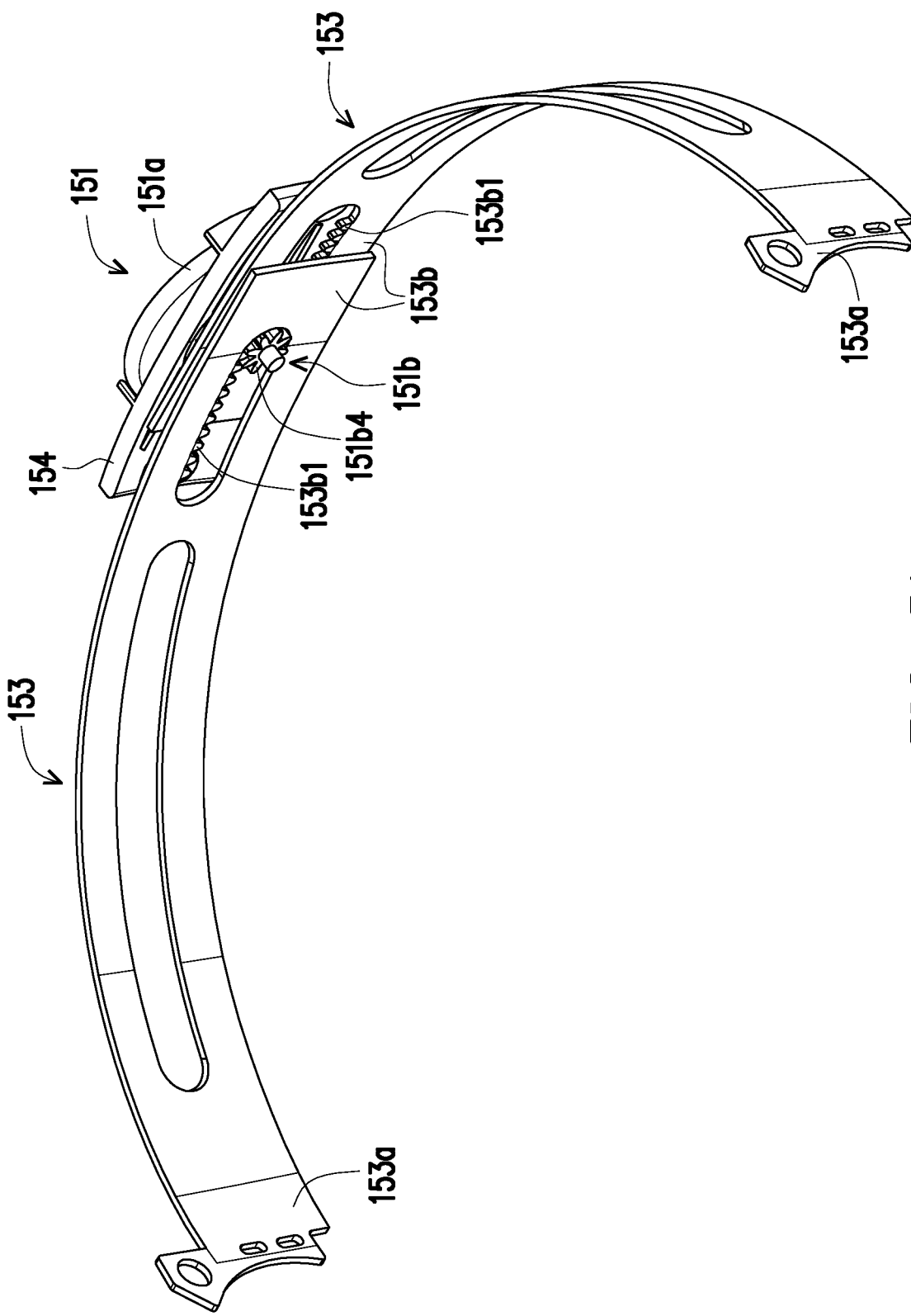
FIG. 5A is a perspective schematic diagram illustrating the rear adjustable fixing assembly of the head-mounted display device of FIG. 1A.

Referring to FIG. 1A, FIG. 1B, and FIG. 4A, in the third implementation aspect of the head-mounted display device 100, the rear adjustable fixing assembly 150 further includes a moving member 152. Two opposite ends of the moving member 152 are slidably disposed at the two opposite ends of the adjustable fixing assembly 130. The rotatable adjusting mechanism 151 is rotatably disposed in the moving member 152. When the rotatable adjusting mechanism 151 is rotated in the first rotation direction C1, the moving member 152 may be moved in the first translational direction D1 due to rotation of the rotatable adjusting mechanism 151 in the first rotation direction C1. When the rotatable adjusting mechanism 151 is rotated in the second rotation direction C2, the moving member 152 may be moved in the second translational direction. FIG. 5A is a perspective schematic diagram illustrating the rear adjustable fixing assembly of the head-mounted display device of FIG. 1A. Referring to FIG. 2C, FIG. 3, and FIG. 5A, specifically, the moving member 152 has a rear slide groove 152a. The rear adjustable fixing assembly 150 further includes a pair of adjusting members 153. The pair of adjusting members 153 are slidably disposed in the rear slide groove 152a. The adjusting member 153 has a fixing end 153a and a moving end 153b opposite to each other. The fixing ends 153a of the pair of adjusting members 153 are fixed to the two opposite ends of the adjustable fixing assembly 130. The moving ends 153b of the pair of adjusting members 153 are overlapped with each other, and the rotatable adjusting mechanism 151 is coupled to the moving ends 153b of the pair of adjusting members 153.

Figure 2D:
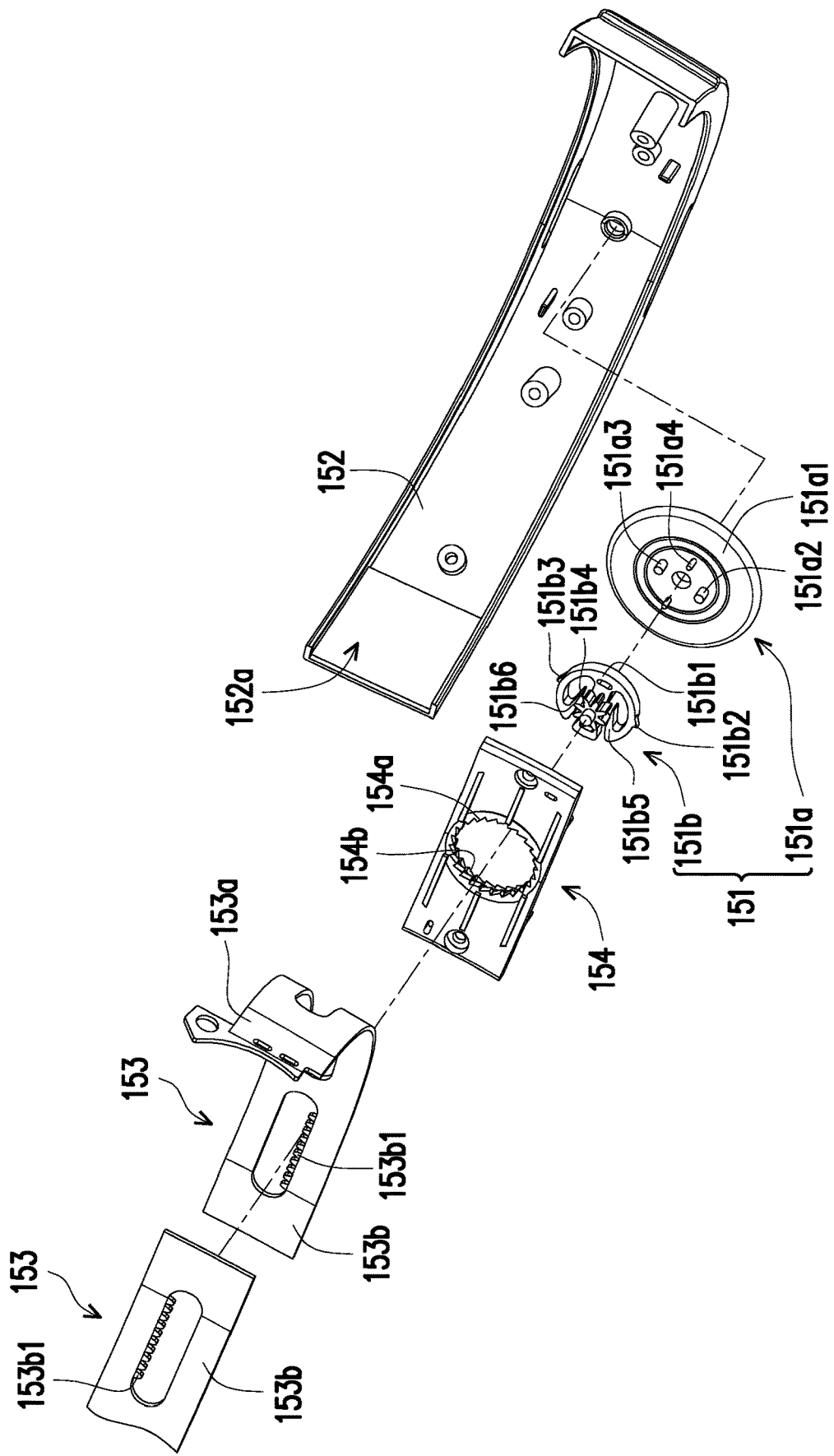
Figure 5B:
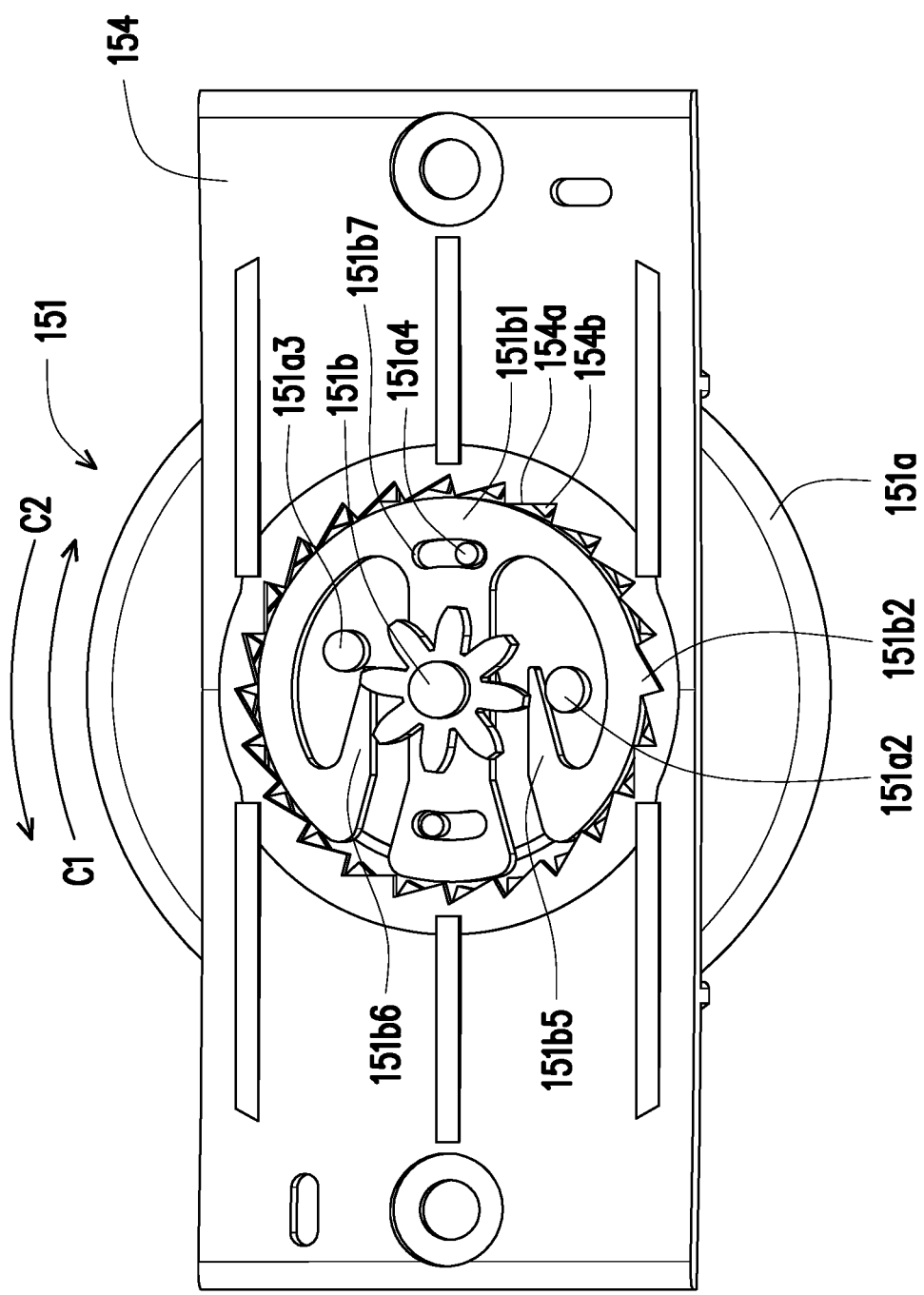
FIG. 5B is a schematic diagram illustrating part of components of the rear adjustable fixing assembly of FIG. 5A.

FIG. 5B is a schematic diagram illustrating part of components of the rear adjustable fixing assembly of FIG. 5A. Referring to FIG. 2D, FIG. 5A, and FIG. 5B, on the other hand, the rear adjustable fixing assembly 150 further includes a fixing member 154. The rear adjustable fixing assembly 150 includes a first ratchet 154a and a second ratchet 154b respectively on two opposite side surfaces of the fixing member, and configuration orientations of the first ratchet 154a and the second ratchet 154b are opposite to each other. The rotatable adjusting mechanism 151 includes an adjusting knob 151a and a driving member 151b. The driving member 151b is rotatably disposed on the adjusting knob 151a. The adjusting knob 151a includes a rotation portion 151a1, a first propping portion 151a2, a second propping portion 151a3, and an actuation portion 151a4. The rotation portion 151a1 is rotatably disposed on the moving member 152 of the rear adjustable fixing assembly 150. The first propping portion 151a2 is connected to the rotation portion 151a1. The second propping portion 151a3 is connected to the rotation portion 151a1. The actuation portion 151a4 is connected to the rotation portion 151a1. The driving member 151b includes a body portion 151b1, a first engagement portion 151b2, a second engagement portion 151b3, and an elongated slot 151b7. The first propping portion 151a2 actuates the first engagement portion 151b2 to move in a direction away from the first ratchet 154a. The second propping portion 151a3 actuates the second engagement portion 151b3 to move in a direction away from the second ratchet 154b. The actuation portion 151a4 penetrates through the elongated slot 151b7 to allow the adjusting knob 151a to drive the driving member 151b.

Specifically, the driving member 151b includes a first moving portion 151b5 corresponding to the first propping portion 151a2 and a second moving portion 151b6 corresponding to the second propping portion 151a3. The first moving portion 151b5 is connected to the body portion 151b1 and has elasticity. The first engagement portion 151b2 is disposed at the first moving portion 151b5 to be moved simultaneously with the first moving portion 151b5. The second moving portion 151b6 is connected to the body portion 151b1 and has elasticity. The second engagement portion 151b3 is disposed at the second moving portion 151b6 to be moved simultaneously with the second moving portion 151b6.

On the other hand, the pair of adjusting members 153 of the rear adjustable fixing assembly 150 respectively include a gear rack 153b1 at their moving ends 153b. The driving member 151b of the rotatable adjusting mechanism 151 includes a gear 151b4 connected to the body portion 151b1. Moreover, the gear racks 153b1 of the adjusting members 153 are engaged with the gear 151b4 of the rotatable adjusting mechanism 151.

When the user applies a force to rotate the adjusting knob 151a in the first rotation direction C1, the adjusting knob 151a drives the driving member 151b to rotate in the first rotation direction C1. The first propping portion 151a2 pushes an inclined plane of the first moving portion 151b5 to actuate the first engagement portion 151b2 to move in the direction away from the first ratchet 154a. The second propping portion 151a3 does not actuate the second moving portion 151b6 and the second engagement portion 151b3, and the second engagement portion 151b3 is engaged with the second ratchet 154b and generates ratchet wheel actuation on the second ratchet 154b. It is noted that the first propping portion 151a2 is used here to actuate the first moving portion 151b5 to drive the first engagement portion 151b2, because the first engagement portion 151b2 and the first ratchet 154a form a set of ratchet wheel, and the first engagement portion 151b2 is configured to generate ratchet wheel actuation only in the second rotation direction C2.

On the other hand, when the user applies a force to rotate the adjusting knob 151a in the second rotation direction C2, the adjusting knob 151a drives the driving member 151b to rotate in the second rotation direction C2. The second propping portion 151a3 pushes an inclined plane of the second moving portion 151b6 to actuate the second engagement portion 151b3 to move in the direction away from the second ratchet 154b. The first propping portion 151a2 does not actuate the first moving portion 151b5 and the first engagement portion 151b2, and the first engagement portion 151b2 is engaged with the first ratchet 154b and generates ratchet wheel actuation on the first ratchet 154a. It is noted that the second propping portion 151a3 is used here to actuate the second moving portion 151b6 to drive the second engagement portion 151b3, because the second engagement portion 151b3 and the second ratchet 154b form a set of ratchet wheel, and the second engagement portion 151b3 is configured to generate ratchet wheel actuation only in the first rotation direction C1.

In other words, configuration orientations of the first ratchet 154a and the second ratchet 154b are opposite to each other, and orientations of the first engagement portion 151b2 and the second engagement portion 151b3 are configured to correspond to the first ratchet 154a and the second ratchet 154b. Therefore, rotation directions allowed by the first engagement portion 151b2 and the second engagement portion 151b3 are opposite to each other. When the user removes the force applied to the adjusting knob 151a, since the first moving portion 151b5 and the second moving portion 151b6 themselves have elasticity, they bounce back and cause the first engagement portion 151b2 to be engaged with the first ratchet 154a and cause the second engagement portion 151b3 to be engaged with the second ratchet 154b. Moreover, the first engagement portion 151b2 and the first ratchet 154a create blocking effect, and the second engagement portion 151b3 and the second ratchet 154b create blocking effect, which thereby limit rotation of the driving member 151b in the first rotation direction C1 and the second rotation direction C2. Accordingly, when the adjusting knob 151a is not rotated by any external force, the blocking force between the first engagement portion 151b2 and the first ratchet and the blocking force between the second engagement portion 151b3 and the second ratchet 154b may be used to prevent loosening generated in the rear adjustable fixing assembly 150, which enhances user experience for the user using the head-mounted display device 100.

Figure 4B:
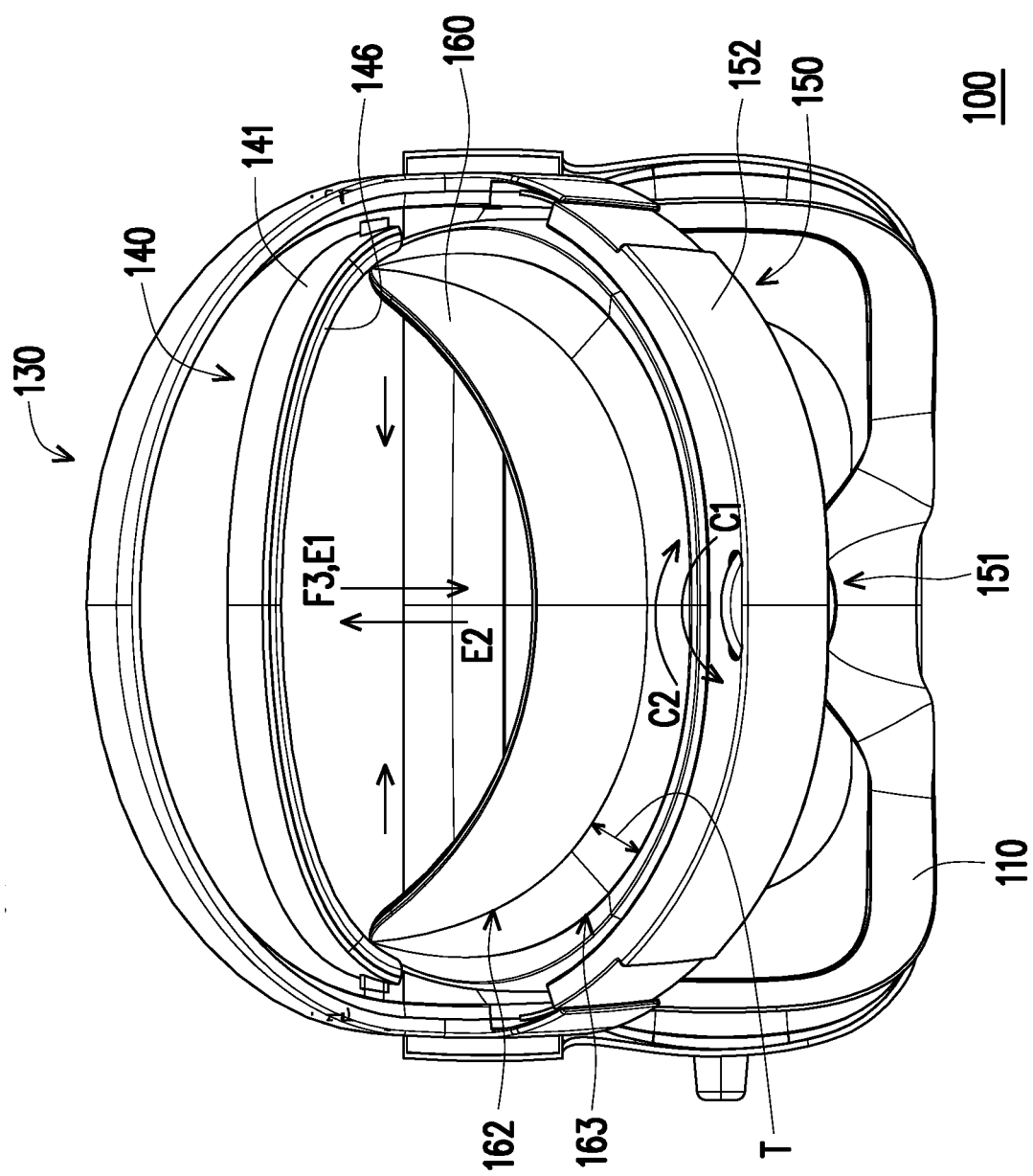
FIG. 4B is a rear-view schematic diagram illustrating a rear adjustable fixing assembly of the head-mounted display device of FIG. 4A after moving in a second translational direction.

FIG. 5C and FIG. 5D are schematic diagrams illustrating actuations of the rear adjustable fixing assembly of FIG. 5A. Referring to FIG. 3, FIG. 5A, and FIG. 5C, when the adjusting knob 151a is rotated in the first rotation direction C1, the adjusting knob 151a drives the gear 151b4 to rotate in the first rotation direction C1, and the gear 151b4 further drives the gear racks 153b1 to move. At this time, the moving end 153b of the adjusting member 153 is moved toward the fixing end 153a of the other adjusting member 153. Therefore, an overlapping segment of the pair of adjusting members 153 is increased, and an overall length is decreased, such that the rear adjustable fixing assembly 150 is moved in the first translational direction D1, as shown in FIG. 4A and FIG. 5D. When the adjusting knob 151a is rotated in the second rotation direction C2, the adjusting knob 151a drives the gear 151b4 to rotate in the second rotation direction C2, and the gear 151b4 further drives the gear racks 153b1 to move. At this time, the moving end 153b of the adjusting member 153 is moved in a direction away from the fixing end 153a of the other adjusting member 153. Therefore, the overlapping segment of the pair of adjusting members 153 is decreased, and the overall length is increased, such that the rear adjustable fixing assembly 150 is moved in the second translational direction D2, as shown in FIG. 4B and FIG. 5C. By fine-tuning the rear adjustable fixing assembly 150, the head-mounted display device 100 may be in better contact with the occipital bone of the user's head. Accordingly, the head-mounted display device 100 is adapted to head shapes of different users, and the rear adjustable fixing assembly 150 is easy to adjust and operate.

FIG. 4B is a rear-view schematic diagram illustrating the rear adjustable fixing assembly of the head-mounted display device of FIG. 4A after moving in the second translational direction. Referring to FIG. 1A, FIG. 4A, and FIG. 4B, in the third implementation aspect of the head-mounted display device 100, the head-mounted display device 100 may further include an elastic cover member 160. The elastic cover member 160 may be in contact with the occipital bone of the user's head, and a material of the elastic cover member 160 is, for example, thermoplastic polyurethanes (TPU). The elastic cover member 160 is fixed to the adjustable fixing assembly 130. The elastic cover member 160 may be subjected to a propping force F3 to move in a first movement direction E1. Moreover, two opposite ends of the elastic cover member 160 may be moved in directions toward each other due to the propping force F3 to cover the occipital bone of the user's head. When the propping force F3 is removed from the elastic cover member 160 that has been moved in the first movement direction E1, the elastic cover member 160 may be moved in a second movement direction E2 opposite to the first movement direction E1, and the two opposite ends of the elastic cover member 160 may be moved in directions away from each other. For example, the first movement direction E1 is a direction away from the front element 110. More specifically, the two opposite ends of the elastic cover member 160 can create the effect of covering the occipital bone of the user's head after being subjected to the propping force F3, because the elastic cover member 160 is provided with a first fold line 162 and a second fold line 163. Two end points of the first fold line 162 are respectively connected to two end points of the second fold line 163. Moreover, the first fold line 162 and the second fold line 163 are spaced apart by a gap T. After the elastic cover member 160 is subjected to the propping force F3, folding is created at the first fold line 162 and the second fold line 163. As the elastic cover member 160 is folded and moved in the first movement direction E1, the two opposite ends of the elastic cover member 160 are moved in directions toward each other due to influence of the first fold line 162 and the second fold line 163. By fine-tuning the elastic cover member 160, the head-mounted display device 100 may be in better contact with the occipital bone of the user's head. Accordingly, the head-mounted display device 100 is adapted to head shapes of different users, and the elastic cover member 160 is easy to adjust and operate.

It is noted that the structures of the head-mounted display device 100 in the first implementation aspect, the second implementation aspect, and the third implementation aspect may be operated independently or may be combined with each other, and the application is not limited hereto. For example, it is possible that the first implementation aspect of the head-mounted display device 100 does not include the structures of the second implementation aspect and the third implementation aspect or may be combined with one or both of the structures of the second implementation aspect and the third implementation aspect. Similarly, it is also possible that the second implementation aspect of the head-mounted display device 100 does not include the structures of the first implementation aspect and the third implementation aspect or may be combined with one or both of the structures of the first implementation aspect and the third implementation aspect. Similarly, it is also possible that the third implementation aspect of the head-mounted display device 100 does not include the structures of the first implementation aspect and the second implementation aspect or may be combined with one or both of the structures of the first implementation aspect and the second implementation aspect, and the application is not limited hereto.

In summary of the above, in the head-mounted display device of the embodiments of the application, after the adjustable fixing assembly is subjected to the external force to move in the first movement direction, the internal space of the head-mounted display device is increased accordingly and may be adapted to a larger head shape. At this time, the head-mounted display device with the increased internal space may be fit around the user's head. After the external force is removed and the adjustable fixing assembly is moved in the second movement direction, the internal space of the head-mounted display device is decreased accordingly, and the head-mounted display device is closely fit around the user's head. Accordingly, the head-mounted display device is adapted to head shapes of different users, and the adjustable fixing assembly is easy to adjust and operate.

Moreover, the adjustable fixing assembly further includes the pivot members fixed to the two opposite ends of the frame, and the frame is rotatably disposed at the connection members via the pivot members. This configuration makes it convenient for the user to fine-tune the angle of the adjustable fixing assembly such that the adjustable fixing assembly may be in better contact with the user's head.

In addition, by fine-tuning the top adjustable fixing assembly, the head-mounted display device may be in better contact with the parietal bone of the user's head. Accordingly, the head-mounted display device is adapted to head shapes of different users, and the top adjustable fixing assembly is easy to adjust and operate.

Furthermore, by fine-tuning the rear adjustable fixing assembly, the head-mounted display device may be in better contact with the occipital bone of the user's head. Accordingly, the head-mounted display device is adapted to head shapes of different users, and the rear adjustable fixing assembly is easy to adjust and operate.

In addition, by fine-tuning the elastic cover member, the head-mounted display device may be in better contact with the occipital bone of the user's head. Accordingly, the head-mounted display device is adapted to head shapes of different users, and the elastic cover member is easy to adjust and operate.

Moreover, the top adjustable fixing assembly and the rear adjustable fixing assembly may be respectively in contact with the parietal bone and the occipital bone of the user's head, and the front element may cover the eyes of the user. Therefore, the front element, the top adjustable fixing assembly, and the rear adjustable fixing assembly may be respectively in contact with the user's eyes, parietal bone, and occipital bone. By increasing the number of contact positions between the head-mounted display device and the user's head, the head-mounted display device is more securely mounted on the user's head and does not fall off easily. Moreover, the pressure applied by the head-mounted display device on the user's head is distributed to a plurality of contact positions, which enhances comfort for the user to wear the head-mounted display device.

Although the application is disclosed as the embodiments above, the embodiments are not meant to limit the application. Any person skilled in the art may make slight modifications and variations without departing from the spirit and scope of the application. Therefore, the protection scope of the application shall be defined by the claims attached below.

What is claimed is:

1. A head-mounted display device comprising:
   a front element adapted to be placed or be installed with a display device;
   a pair of extending portions respectively connected to two opposite ends of the front element; and
   an adjustable fixing assembly, two opposite ends of the adjustable fixing assembly being slidably disposed at the pair of extending portions, wherein the adjustable fixing assembly is adapted to be subjected to an external force to move in a first sliding direction away from the front element, and when the external force is removed from the adjustable fixing assembly that has been moved in the first sliding direction, the adjustable fixing assembly is adapted to move in a second sliding direction opposite to the first sliding direction.

2. The head-mounted display device according to claim 1, wherein the adjustable fixing assembly comprises:
   a frame; and
   a pair of connection members respectively connected to two opposite ends of the frame, and the pair of connection members being slidably disposed on the pair of extending portions.

3. The head-mounted display device according to claim 2, wherein the two opposite ends of the frame are rotatably disposed at the pair of connection members.

4. The head-mounted display device according to claim 2, wherein each of the extending portions comprises a slide groove, and the adjustable fixing assembly comprises:
   a sliding member fixed to the connection member and slidably disposed in the slide groove;
   a first fixing portion disposed in the slide groove;
   a second fixing portion disposed on the sliding member; and
   a restoring member, two opposite ends of the restoring member being respectively fixed to the first fixing portion and the second fixing portion.

5. The head-mounted display device according to claim 4, wherein each of the extending portions has a first end and a second end opposite to each other, the second end comprises a first stop portion, the sliding member comprises a second stop portion corresponding to the first stop portion, and the second stop portion is adapted to reciprocatingly slide between the first end and the second end.

6. The head-mounted display device according to claim 1, further comprising:
   a top adjustable fixing assembly, two opposite ends of the top adjustable fixing assembly being slidably disposed at the adjustable fixing assembly, wherein the top adjustable fixing assembly is adapted to be subjected to an acting force to move in a first deviation direction, the two opposite ends of the top adjustable fixing assembly are adapted to move in directions toward each other due to the acting force, and when the acting force is removed from the top adjustable fixing assembly that has been moved in the first deviation direction, the top adjustable fixing assembly is adapted to move in a second deviation direction opposite to the first deviation direction, and the two opposite ends of the top adjustable fixing assembly are adapted to move in directions away from each other.

7. The head-mounted display device according to claim 1, further comprising:
   a rear adjustable fixing assembly comprising a rotatable adjusting mechanism, two opposite ends of the rear adjustable fixing assembly being slidably disposed at the adjustable fixing assembly, wherein the rotatable adjusting mechanism is adapted to rotate in a first rotation direction, the rear adjustable fixing assembly is adapted to move in a first translational direction perpendicular to the first rotation direction due to rotation of the rotatable adjusting mechanism in the first rotation direction, and when the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

8. The head-mounted display device according to claim 7, wherein the first translational direction is a direction toward the front element.

9. The head-mounted display device according to claim 1, further comprising:
an elastic cover member fixed to the adjustable fixing assembly, wherein two opposite ends of the elastic cover member are adapted to be subjected to a propping force to move in a first movement direction, the two opposite ends of the elastic cover member are adapted to move in directions toward each other due to the propping force, and when the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

10. The head-mounted display device according to claim 9, wherein the first movement direction is a direction away from the front element.

11. A head-mounted display device comprising:
a front element adapted to be placed or be installed with a display device;
a pair of extending portions respectively connected to two opposite ends of the front element;
an adjustable fixing assembly comprising a frame, wherein the frame comprises:
a body portion, two opposite ends of the body portion being connected to the pair of extending portions; and
a pair of protruding portions respectively connected to the two opposite ends of the body portion;
a top adjustable fixing assembly, two opposite ends of the top adjustable fixing assembly being connected to the body portion; and
a rear adjustable fixing assembly, two opposite ends of the rear adjustable fixing assembly being connected to the pair of protruding portions, wherein an included angle is present between the body portion and the protruding portion.

12. The head-mounted display device according to claim 11, wherein the included angle ranges from 30° to 150°.

13. The head-mounted display device according to claim 11, wherein the two opposite ends of the top adjustable fixing assembly are slidably disposed at the body portion, wherein the top adjustable fixing assembly is adapted to be subjected to an acting force to move in a first deviation direction, the two opposite ends of the top adjustable fixing assembly are adapted to move in directions toward each other due to the acting force, and when the acting force is removed from the top adjustable fixing assembly that has been moved in the first deviation direction, the top adjustable fixing assembly is adapted to move in a second deviation direction opposite to the first deviation direction, and the two opposite ends of the top adjustable fixing assembly are adapted to move in directions away from each other.

14. The head-mounted display device according to claim 11, wherein the body portion comprises a top slide groove, and the top adjustable fixing assembly comprises:
a flexible body;
a top sliding member fixed to the flexible body and slidably disposed in the top slide groove;
a first top fixing portion disposed in the top slide groove;
a second top fixing portion disposed on the top sliding member; and
a top restoring member, two opposite ends of the top restoring member being respectively fixed to the first top fixing portion and the second top fixing portion.

15. The head-mounted display device according to claim 11, wherein the top adjustable fixing assembly further comprises a buffer material layer.

16. The head-mounted display device according to claim 14, wherein the flexible body is adapted to be subjected to an acting force to move in a first deviation direction, two opposite ends of the flexible body are adapted to move in directions toward each other due to the acting force, and when the acting force is removed from the flexible body that has been moved in the first deviation direction, the flexible body is adapted to move in a second deviation direction opposite to the first deviation direction, and the two opposite ends of the flexible body are adapted to move in directions away from each other.

17. The head-mounted display device according to claim 11, further comprising:
an elastic cover member fixed to the rear adjustable fixing assembly, wherein the elastic cover member is adapted to be subjected to a propping force to move in a first movement direction, two opposite ends of the elastic cover member are adapted to move in directions toward each other due to the propping force, and when the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

18. The head-mounted display device according to claim 17, wherein the elastic cover member comprises a soft material layer.

19. The head-mounted display device according to claim 11, wherein two opposite ends of the adjustable fixing assembly are slidably disposed at the pair of extending portions, wherein the adjustable fixing assembly is adapted to be subjected to an external force to move in a first sliding direction away from the front element, and when the external force is removed from the adjustable fixing assembly that has been moved in the first sliding direction, the adjustable fixing assembly is adapted to move in a second sliding direction opposite to the first sliding direction.

20. The head-mounted display device according to claim 11, wherein the two opposite ends of the rear adjustable fixing assembly are slidably disposed at the pair of protruding portions, and the rear adjustable fixing assembly comprises:
a rotatable adjusting mechanism adapted to rotate in a first rotation direction, wherein the rear adjustable fixing assembly is adapted to move in a first translational direction perpendicular to the first rotation direction due to rotation of the rotatable adjusting mechanism in the first rotation direction, and when the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

21. A head-mounted display device comprising:
a front element adapted to be placed or be installed with a display device;

a pair of extending portions respectively connected to two opposite ends of the front element;

an adjustable fixing assembly, two opposite ends of the adjustable fixing assembly being connected to the pair of extending portions; and a rear adjustable fixing assembly comprising a rotatable adjusting mechanism, two opposite ends of the rear adjustable fixing assembly being slidably disposed at the two opposite ends of the adjustable fixing assembly, wherein the rotatable adjusting mechanism is adapted to rotate in a first rotation direction, the rear adjustable fixing assembly is adapted to move in a first translational direction perpendicular to the first rotation direction due to rotation of the rotatable adjusting mechanism in the first rotation direction, and when the rotatable adjusting mechanism is rotated in a second rotation direction opposite to the first rotation direction, the rear adjustable fixing assembly is adapted to move in a second translational direction opposite to the first translational direction due to rotation of the rotatable adjusting mechanism in the second rotation direction.

22. The head-mounted display device according to claim 21, wherein the rear adjustable fixing assembly further comprises:

a moving member, two opposite ends of the moving member being slidably disposed at the two opposite ends of the adjustable fixing assembly, the rotatable adjusting mechanism being rotatably disposed in the moving member.

23. The head-mounted display device according to claim 22, wherein when the rotatable adjusting mechanism is rotated in the first rotation direction, the moving member is adapted to move in the first translational direction due to rotation of the rotatable adjusting mechanism in the first rotation direction, and when the rotatable adjusting mechanism is rotated in the second rotation direction, the moving member is adapted to move in the second translational direction.

24. The head-mounted display device according to claim 22, wherein the moving member comprises a rear slide groove, and the rear adjustable fixing assembly further comprises:

a pair of adjusting members movably disposed in the rear slide groove, wherein each of the pair of adjusting members has a fixing end and a moving end opposite to each other, the fixing ends of the pair of adjusting members are fixed to the two opposite ends of the adjustable fixing assembly, the moving ends of the pair of adjusting members are overlapped with each other, and the rotatable adjusting mechanism is coupled to the moving ends of the adjusting members.

25. The head-mounted display device according to claim 24, wherein the moving end of each of the adjusting members comprises a gear rack, the rotatable adjusting mechanism comprises a gear, and the gear rack of each of the adjusting members is engaged with the gear of the rotatable adjusting mechanism.

26. The head-mounted display device according to claim 21, wherein two opposite side surfaces of the rear adjustable fixing assembly respectively comprise a first ratchet and a second ratchet, and the rotatable adjusting mechanism comprises:

an adjusting knob comprising:
 a rotation portion rotatably disposed on the rear adjustable fixing assembly;
 a first propping portion connected to the rotation portion; and
 a second propping portion connected to the rotation portion; and a driving member rotatably disposed on the adjusting knob, the driving member comprising:
 a body portion;
 a first engagement portion, wherein the first propping portion is adapted to actuate the first engagement portion to move in a direction away from the first ratchet; and
 a second engagement portion, wherein the second propping portion is adapted to actuate the second engagement portion to move in a direction away from the second ratchet.

27. The head-mounted display device according to claim 26, wherein when the adjusting knob is rotated in the first rotation direction, the adjusting knob drives the driving member to rotate in the first rotation direction, the first propping portion actuates the first engagement portion to move in the direction away from the first ratchet, the second propping portion does not actuate the second engagement portion, and the second engagement portion generates ratchet wheel actuation on the second ratchet, and when the adjusting knob is rotated in the second rotation direction, the adjusting knob drives the driving member to rotate in the second rotation direction, the second propping portion actuates the second engagement portion to move in the direction away from the second ratchet, the first propping portion does not actuate the first engagement portion, and the first engagement portion generates ratchet wheel actuation on the first ratchet.

28. The head-mounted display device according to claim 27, wherein the rear adjustable fixing assembly comprises a pair of gear racks, the driving member further comprises a gear, and the pair of gear racks is respectively engaged with the gear, wherein when the adjusting knob is rotated in the first rotation direction, the adjusting knob drives the gear to rotate in the first rotation direction, and the gear drives the pair of gear racks to move to allow the rear adjustable fixing assembly to move in the first translational direction, and when the adjusting knob is rotated in the second rotation direction, the adjusting knob drives the gear to rotate in the second rotation direction, and the gear drives the pair of gear racks to move to allow the rear adjustable fixing assembly to move in the second translational direction.

29. The head-mounted display device according to claim 21, further comprising:

an elastic cover member fixed to the rear adjustable fixing assembly, wherein the elastic cover member is adapted to be subjected to a propping force to move in a first movement direction, two opposite ends of the elastic cover member are adapted to move in directions toward each other due to the propping force, and when the propping force is removed from the elastic cover member that has been moved in the first movement direction, the elastic cover member is adapted to move in a second movement direction opposite to the first movement direction, and the two opposite ends of the elastic cover member are adapted to move in directions away from each other.

30. The head-mounted display device according to claim 29, wherein the elastic cover member comprises a first fold line and a second fold line, two opposite ends of the first fold line are respectively connected to two opposite ends of the second fold line, and a gap is present between the first fold line and the second fold line.

\* \* \* \* \*